United States Patent [19]
Dickson

[11] Patent Number: 4,910,153
[45] Date of Patent: * Mar. 20, 1990

[54] DEPOSITION FEEDSTOCK AND DOPANT MATERIALS USEFUL IN THE FABRICATION OF HYDROGENATED AMORPHOUS SILICON ALLOYS FOR PHOTOVOLTAIC DEVICES AND OTHER SEMICONDUCTOR DEVICES

[75] Inventor: Charles R. Dickson, Trenton, N.J.

[73] Assignee: Solarex Corporation, Rockville, Md.

[ * ] Notice: The portion of the term of this patent subsequent to Sep. 1, 2004 has been disclaimed.

[21] Appl. No.: 315,172

[22] Filed: Feb. 24, 1989

Related U.S. Application Data

[63] Continuation of Ser. No. 205,547, Jun. 10, 1988, abandoned, which is a continuation of Ser. No. 830,073, Feb. 18, 1986, abandoned.

[51] Int. Cl.$^4$ .............................................. H01L 31/18
[52] U.S. Cl. .................................. 437/4; 136/258; 427/39; 437/100; 437/101; 430/85; 430/86
[58] Field of Search ............... 427/39, 74; 437/4, 100, 437/101; 136/258 AM; 357/2, 30 J, 30 K; 430/85, 86

[56] References Cited

U.S. PATENT DOCUMENTS

| | | | |
|---|---|---|---|
| 3,930,067 | 12/1975 | Gorrissen | 437/233 |
| 4,064,521 | 12/1977 | Carlson | 357/2 |
| 4,142,195 | 2/1979 | Carlson et al. | 357/15 |
| 4,200,666 | 4/1980 | Reinberg | 427/39 |
| 4,217,148 | 8/1980 | Carlson | 136/255 |
| 4,344,984 | 8/1982 | Kaplan et al. | 437/4 |
| 4,363,828 | 12/1982 | Brodsky et al. | 427/39 |
| 4,394,400 | 7/1983 | Green et al. | 427/38 |
| 4,435,445 | 3/1984 | Allred et al. | 427/54.1 |
| 4,491,626 | 1/1985 | Kawamura et al. | 430/69 |
| 4,504,518 | 3/1985 | Ovshinsky et al. | 427/38 |
| 4,546,008 | 10/1985 | Saitoh et al. | 427/38 |
| 4,564,533 | 1/1986 | Yamazaki | 427/39 |
| 4,568,626 | 2/1986 | Ogawa | 430/128 |
| 4,600,801 | 7/1986 | Guha et al. | 136/249 |
| 4,690,830 | 9/1987 | Dickson et al. | 427/38 |
| 4,695,331 | 9/1987 | Ramaprasad | 437/126 |

FOREIGN PATENT DOCUMENTS

| | | | |
|---|---|---|---|
| 59-57909 | 3/1984 | Japan | |
| 60-47474 | 3/1985 | Japan | 136/258 AM |
| 61-99150 | 5/1986 | Japan | 136/258 AM |

OTHER PUBLICATIONS

D. D. Allred et al., "CVD Amorphous Germanium. Preparation and Properties," Energy Conversion Devices, (1984), Proc. vol. 84–6, Troy, Mich., (Abstract Only).

Mackenzie et al., "Structural Electrical and Optical Properties of Si1—xGe:H and An Inferred Electronic
(List continued on next page.)

*Primary Examiner*—Aaron Weisstuch
*Attorney, Agent, or Firm*—Finnegan, Henderson, Farabow, Garrett & Dunner

[57] ABSTRACT

Compounds having the formula $(MX_3)_n M'X_{4-n}$ wherein M and M' are different Group 4A atoms, at least one of M and M' is silicon, X is hydrogen, halogen or mixtures thereof, and n is an integer between 1 and 4, inclusive, are useful as deposition feedstock materials in the formation of hydrogenated amorphous silicon alloys useful in the fabrication of photovoltaic and other electronically active devices.

Dopants having the formula $(SiX_3)_m L X_{3-m}$ wherein L is a Group 5A atom selected from the group of phosphorous, arsenic, antimony and bismuth, X is hydrogen, halogen or mixtures thereof and m is an integer between 1 and 3, inclusive, are useful in the fabrication of negatively-doped hydrogenated amorphous silicon alloys useful in the fabrication of photovoltaic and other electronically active devices.

Dopants having the formula $YJX_2$ wherein Y is halogen or carbonyl, J is a Group 3A atom and X is hydrogen, halogen or mixtures thereof, are useful in the formation of positively-doped hydrogenated amorphous silicon alloys useful in the fabrication of photovoltaic and other electronically active devices.

20 Claims, 7 Drawing Sheets

OTHER PUBLICATIONS

Band Structure," Phys. Rev. B. (Feb. 15, 1985), vol. 31, (4), pp. 2198–2212, (Abstract Only).

Lucovsky et al., "Chemical Bonding of Hydrogen and Oxygen in Glow—Discharge Deposited Thin Films of a—Ge: and a—Ge": (HO) Phys. Rev., B, (Feb. 15, 1985), vol. 31, (4), pp. 2190–2197, (Abstract Only).

Stewart et al., "Electronic Transporting Glow-Discharge Microcrystalline Germanium," Philos. Mag. B. (Oct. 1983), vol. 48 (4), pp. 333–340, (Abstract Only).

Fuhs, "Electronic Properties of Amorphous Silicon (a–Si–H). Final Report," BMFT–FB–T-83-154, Aug. 1983, (Abstract Only).

Von Roedern et al., "Optical Absorption, Photoconductivity, and Photoluminescene of Glow-Discharge Amorphous Si1—xGe Alloys," Phys. Rev., B (Jun. 15, 1982), vol. 25, (12), pp. 7678–7687, (abstract only).

Choo et al., "Silicon and Germanium—Substitution in Silylgermane, $H_3SiGeH_3$," J. Chem. Res., Synop., (3), (1981).

Paquin et al., "Kinetics of the Decomposition of 1,1,1--Trimethyldisilane, and of Trimethylsilylgermane and of Relative Rates of of Silylene Insertion into Silicon—Hydrogen Bonds," J. Am. Chem. Soc., vol. 99 (6), pp. 1793–7, (1977), (abstract only).

MacKay et al., "Silicon-Germanium Hydrides, $Si_2GeH_8$ and $SiGe_2H_8$," J. Chem. Soc. (A), vol. 19, pp. 2937–2942, (1969).

Halberg et al., "Silicon-Germanium Alloy Growth Control and Characterization," J. Electron. Matxer. (U.S.A.), vol. 11, No. 4, pp. 779–93, (Jul. 1982), (abstract only).

Senzaki et al., "A 15 $Nb_3Ge$ Film Synthesis by Reactive Sputtering Using Germane," Bull. Electrotech. Lab. (Japan), vol. 46, No. 9, pp. 462–7, (1982), (abstract only).

Andreatta et al., "Low-Temperature Growth of Polycrystalline Si and Ge Gilms by Ultraviolet Laser Photodissociation of Silane and Germane," Appl. Phys. Lett. (U.S.A.), vol. 40, No. 2, pp. 183–5, (Jan. 15, 1982), (abstract only).

Duchemin et al., "A New Method for Growing Gaas Epilayers by low Pressure Organometallics," J. Electrochem. Soc. (U.S.A.), vol. 126, No. 126, No. 7, pp. 1134–1142, (Jul. 1979), (abstract only).

Zanio et al., "Deposition of Ge Epitaxial Layers on Ge and Gass Substrates by Vacuum Pyrolysis," J. Vac. Sci. and Technol., (U.S.A.), vol. 15, No. 1, pp. 119–122, (Jan.–Feb. 1978), (abstract only).

Fritzsche, "The Nature of Localized States and the Effect of Doping in Amorphous Semiconductors," Chin. J. Phys. (Taiwan), vol. 15, No. 2, pp. 73–91, (Summer 1977), (abstract only).

DEPOSITION FEEDSTOCK AND DOPANT MATERIALS USEFUL IN THE FABRICATION OF HYDROGENATED AMORPHOUS SILICON ALLOYS FOR PHOTOVOLTAIC DEVICES AND OTHER SEMICONDUCTOR DEVICES

This application is a continuation of application Ser. No. 205,547, filed June 10, 1988, now abandoned, which was a continuation of application Ser. No. 830,073, filed Feb. 18, 1986, now abandoned.

BACKGROUND OF THE INVENTION

The present invention relates to hydrogenated amorphous silicon alloys useful in the fabrication of photovoltaic devices and other semiconductor devices.

It is desirable to include carbon or germanium atoms in hydrogenated amorphous silicon alloys in order to adjust their optical bandgap. For example, carbon has a larger bandgap than silicon and thus inclusion of carbon in a hydrogenated amorphous silicon alloy increases the alloy's bandgap. Conversely, germanium has a smaller bandgap than silicon and thus inclusion of germanium in a hydrogenated amorphous silicon alloy decreases the alloy's bandgap.

Similarly it is desirable to incorporate boron or phosphorus atoms in hydrogenated amorphous silicon alloys in order to adjust their conductive properties. Including boron in a hydrogenated amorphous silicon alloy creates a positively doped conductive region. Conversely, including phosphorus in a hydrogenated amorphous silicon alloy creates a negatively doped conductive region.

Hydrogenated amorphous silicon alloy films are prepared by deposition in a deposition chamber. Heretofore, in preparing hydrogenated amorphous silicon alloys by deposition in a deposition chamber, carbon, germanium, boron or phosphorus have been incorporated into the alloys by including in the deposition gas mixture carbon, germanium, boron or phosphorus containing gases such as methane ($CH_4$), germane ($GeH_4$), germanium tetrafluoride ($GeF_4$), higher order germanes such as digermane ($Ge_2H_6$), diborane ($B_2H_6$) or phosphine ($PH_3$). See for example, U.S. Pat. Nos. 4,491,626, 4,142,195, 4,363,828, 4,504,518, 4,344,984, 4,435,445, and 4,394,400. A drawback of this practice, however, is that the way in which the carbon, germanium, boron or phosphorus atoms are incorporated into the hydrogenated amorphous silicon alloy is not controlled. That is, these elements are incorporated into the resulting alloy in a highly random manner thereby increasing the likelihood of undesirable chemical bonds.

SUMMARY OF THE INVENTION

It is, therefore, an object of the present invention to provide hydrogenated amorphous silicon alloys that overcome these drawbacks.

It is a more specific object of the present invention to enhance the control of the manner in which atoms from Group 4A of the Periodic Table, such as carbon and germanium, are incorporated into hydrogenated amorphous silicon alloys thereby decreasing the likelihood of undesirable chemical bonds.

It is another object of the present invention to enhance the control of the manner in which atoms from Group 3A of the Period Table, such as boron, aluminum and gallium are incorporated into hydrogenated amorphous silicon alloys thereby decreasing the likelihood of undesirable chemical bonds.

It is still another object of the present invention to enhance the control of the manner in which atoms from Group 5A of the Periodic Table, such as phosphorus and arsenic are incorporated into hydrogenated amorphous silicon alloys thereby decreasing the likelihood of undesirable chemical bonds.

An additional object of this invention is to reduce or eliminate undesirable dangling electron bonds in such hydrogenated amorphous silicon alloys.

A further object of the invention is to provide hydrogenated amorphous silicon alloy films having improved electronic characteristics.

Another object of this invention is to provide hydrogenated amorphous silicon alloy films having improved optical characteristics.

A still further object of this invention is to provide hydrogenated amorphous silicon alloy films having improved photoconductivity properties.

An additional object of this invention is to provide photovoltaic devices having enhanced efficiencies in converting solar energy to electrical energy.

Another object of this invention is to provide photovoltiic devices having improved fill factors, i.e., improved ratios of maximum to ideal power points achieved by the photovoltaic device.

Still another object of this invention is to provide photovoltaic devices having an improved blue response.

A further object of the invention is to provide photovoltaic devices having an improved red response.

Additional objects and advantages of the invention will be set forth in part in the description which follows, and in part will be apparent from the description, or may be learned by practice of the invention. The objects and advantages of the invention may be realized and obtained by means of instrumentalities and combinations particularly pointed out in the appended claims.

To achieve the objects, and in accordance with the purpose of the invention, as embodied and broadly described herein, the invention includes a method of using one or more compounds having the formula:

$$(MX_3)_n M'X_{4-n} \qquad \text{I}$$

wherein M and M' are different Group 4A atoms, at least one of M and M' is silicon, X is hydrogen, halogen or mixtures thereof, and n is an integer between 1 and 4, inclusive, as a deposition feedstock material in the fabrication of hydrogenated amorphous silicon alloy.

To further achieve the objects and in accordance with the purpose of the invention as embodied and broadly described herein, the invention also includes a process for preparing hydrogenated amorphous silicon alloy by deposition of hydrogenated amorphous silicon alloy film onto a substrate in a deposition chamber comprising the step of introducing into the deposition chamber during deposition a deposition gas mixture which includes one or more compounds of the above formula I.

To further achieve the objects and in accordance with the purpose of the invention as embodied and broadly described herein, the invention also includes an improved semiconductor device comprising one or more hydrogenated amorphous silicon alloy regions made from one or more compounds of the above formula I.

To further achieve the objects and in accordance with the purpose of the invention as embodied and broadly described herein, the invention also includes a method of manufacturing a semiconductor device comprising depositing on a substrate one or more hydrogenated amorphous silicon alloy regions from one or more compounds of the above formula I.

To further achieve the objects and in accordance with the purpose of the invention as embodied and broadly described herein, the invention also includes a semiconductor device comprising one or more hydrogenated amorphous silicon regions wherein at least one of the regions is made by deposition of hydrogenated amorphous silicon alloy in a deposition chamber by introducing into the deposition chamber a deposition gas mixture which includes one or more compounds of the above formula I.

To further achieve the objects and in accordance with the purpose of the invention as embodied and broadly described herein, the invention also includes a process for preparing a semiconductor device comprising the step of depositing on a substrate one or more hydrogenated amorphous silicon alloy regions, at least one of the regions being made by introducing into a deposition chamber during deposition a deposition gas mixture which includes one or more compounds of the above formula I.

To further achieve the objects and in accordance with the purpose of the invention as embodied and broadly described herein, the invention also includes a photovoltaic device comprising a front contact, a back contact and one or more hydrogenated amorphous silicon regions between the front and back contacts, wherein at least one of the regions is a hydrogenated amorphous silicon alloy made by deposition in a deposition chamber by introducing into the deposition chamber a deposition gas mixture which includes one or more compounds of the above formula I.

To further achieve the objects and in accordance with the purpose of the invention as embodied and broadly described herein, the invention also includes a process for manufacturing a photovoltaic device comprising depositing one or more hydrogenated amorphous silicon regions between a front and back contact wherein at least one of the regions is a hydrogenated amorphous silicon alloy made by deposition in a deposition chamber by introducing into the deposition chamber a deposition gas mixture which includes one or more compounds of the above formula I.

To further achieve the objects and in accordance with the purpose of the invention as embodied and broadly described herein, the invention also includes a method of using one or more compounds having the formula:

$$(SiX_3)_m L\ X_{3-m} \qquad \text{II}$$

wherein L is a Group 5A atom selected from the group of phosphorus, arsenic, antimony, and bismuth, X is hydrogen, halogen or mixtures thereof, and m is an integer between 1 and 3, inclusive, as a dopant in the fabrication of a negatively-doped hydrogenated amorphous silicon alloy.

To further achieve the objects and in accordance with the purpose of the invention as embodied and broadly described herein, the invention also includes a process for preparing a negatively-doped hydrogenated amorphous silicon alloy by deposition of a negatively-doped hydrogenated amorphous silicon alloy film onto a substrate in a deposition chamber comprising the step of introducing into the deposition chamber during deposition a deposition gas mixture which includes one or more dopants of the above formula II.

To further achieve the objects and in accordance with the purpose of the invention as embodied and broadly described herein, the invention also includes an improved semiconductor device comprising one or more negatively-doped hydrogenated amorphous silicon alloy regions made using one or more dopants of the above formula II.

To further achieve the objects and in accordance with the purpose of the invention as embodied and broadly described herein, the invention also includes a method of manufacturing a semiconductor device comprising depositing on a substrate one or more negatively-doped hydrogenated amorphous silicon alloy regions using one or more dopants of the above formula II.

To further achieve the objects and in accordance with the purpose of the invention as embodied and broadly described herein, the invention also includes a semiconductor device comprising one or more hydrogenated amorphous silicon regions wherein at least one of said regions is a negatively-doped hydrogenated amorphous silicon alloy made by deposition in a deposition chamber by introducing into the deposition chamber a deposition gas mixture which includes one or more dopants of the above formula II.

To further achieve the objects and in accordance with the purpose of the invention as embodied and broadly described herein, the invention also includes a process for preparing a semiconductor device comprising the step of depositing on a substrate one or more hydrogenated amorphous silicon alloy regions, at least one of said regions being a negatively-doped hydrogenated amorphous silicon alloy made by introducing into a deposition chamber during deposition a deposition gas mixture which includes one or more dopants of the above formula II.

To further achieve the objects and in accordance with the purpose of the invention as embodied and broadly described herein, the invention also includes a photovoltaic device comprising a front contact, a back contact, and one or more hydrogenated amorphous silicon regions between the front and back contacts, wherein at least one of the regions is a negatively-doped hydrogenated amorphous silicon alloy made by deposition in a deposition chamber by introducing into the deposition chamber a deposition gas mixture which includes one or more dopants of the above formula II.

To further achieve the objects and in accordance with the purpose of the invention as embodied and broadly described herein, the invention also includes a process for preparing a photovoltaic device comprising depositing one or more hydrogenated amorphous silicon alloy regions between a front and back contact wherein at least one of the regions is a negatively-doped hydrogenated amorphous silicon alloy made by deposition in a deposition chamber by introducing into the deposition chamber a deposition gas mixture which includes one or more dopants of the above formula II.

To further achieve the objects and in accordance with the purpose of the invention as embodied and broadly described herein, the invention also includes a method of using one or more compounds having the formula:

$$YJX_2 \qquad \text{III}$$

wherein Y is halogen or carbonyl, J is a Group 3A atom and X is hydrogen, halogen or mixtures thereof, as a dopant in the fabrication of a postively-doped hydrogenated amorphous silicon alloy.

To further achieve the objects and in accordance with the purpose of the invention as embodied and broadly described herein, the invention also includes a process for preparing a positively-doped hydrogenated amorphous silicon alloy by deposition of a positively-doped hydrogenated amorphous silicon alloy film onto a substrate in a deposition chamber comprising the step of introducing into the deposition chamber during deposition a deposition gas mixture which includes one or more dopants of the above formula III.

To further achieve the objects and in accordance with the purpose of the invention as embodied and broadly described herein, the invention also includes an improved semiconductor device comprising one or more positively-doped hydrogenated amorphous silicon alloy regions made using one or more dopants of the above formula III.

To further achieve the objects and in accordance with the purpose of the invention as embodied and broadly described herein, the invention also includes a method of manufacturing a semiconductor device comprising depositing on a substrate one or more positively-doped hydrogenated amorphous silicon alloy regions using one or more dopants of the above formula III.

To further achieve the objects and in accordance with the purpose of the invention as embodied and broadly described herein, the invention also includes a semiconductor device comprising one or more hydrogenated amorphous silicon regions wherein at least one of said regions is a positively-doped hydrogenated amorphous silicon alloy made by deposition in a deposition chamber by introducing into the deposition chamber a deposition gas mixture which includes one or more dopants of the above formula III.

To further achieve the objects, and in accordance with the purpose of the invention, as embodied and broadly described herein, the invention also includes a process for preparing a semiconductor device comprising the step of depositing on a substrate one or more hydrogenated amorphous silicon alloy regions, at least one of said regions being a postively-doped hydrogenated amorphous silicon alloy made by introducing into a deposition chamber during deposition a deposition gas mixture which includes one or more dopants of the above formula III.

To further achieve the objects and in accordance with the purpose of the invention as embodied and broadly described herein, the invention also includes a photovoltaic device comprising a front contact, a back contact, and one or more hydrogenated amorphous silicon regions between the front and back contacts, wherein at least one of the regions is a positively-doped hydrogenated amorphous silicon alloy made by deposition in a deposition chamber by introducing into the deposition chamber a deposition gas mixture which includes one or more dopants of the above formula III.

To further achieve the objects and in accordance with the purpose of the invention as embodied and broadly described herein, the invention also includes a process for manufacturing a photovoltaic deice comprising depositing one or more hydrogenated amorphous silicon alloy regions between a front and back contact wherein at least one of the regions is a positively-doped hydrogenated amorphous silicon alloy made by deposition in a deposition chamber by introducing into the deposition chamber a deposition gas mixture which includes one or more dopants of the above formula III.

The foregoing and other objects, features, and advantages of the present invention will be made more apparent from the following description of the preferred embodiments.

DESCRIPTION OF THE PREFERRED EMBODIMENTS

Figure 1:
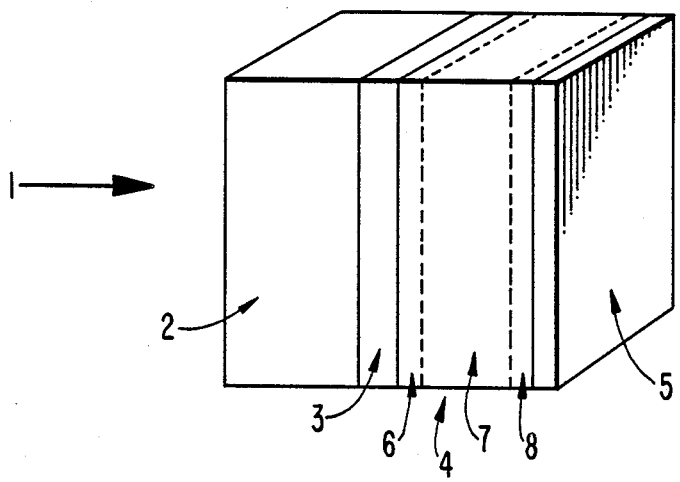
FIG. 1 is an illustration of one embodiment of the present invention wherein a photovoltaic device made in accordance with the present invention includes a p-i-n junction (not to scale).

Reference will now be made in detail to the present preferred embodiments of the invention.

A deposition feedstock material for use in the fabrication of hydrogenated amorphous silicon alloys in accordance with the present invention has the following formula:

$$(MX_3)_n M'X_{4-n} \qquad \text{I}$$

wherein M and M' are different Group 4A atoms, at least one of M and M' is silicon, X is hydrogen, halogen or mixtures thereof, and n is an integer between 1 and 4, inclusive. Inclusion of such compounds in the deposition gas mixture during the deposition of a hydrogenated amorphous silicon alloy film onto a substrate in a deposition chamber permits greater control of the incorporation of the Group 4A atoms into the hydrogenated amorphous silicon alloy, thereby reducing the occurrence of undesirable chemical bonds.

The term "hydrogenated" amorphous silicon alloy refers to amorphous silicon alloy which contains at least some hydrogen atoms incorporated in the amorphous silicon alloy.

The term Group 4A atoms refers to atoms of the elements of Group 4A of the Periodic Table, i.e., carbon (C), silicon (Si), germanium (Ge), tin (Sn), and lead (Pb).

In the preferred embodiments of the invention, M is silicon and M' is carbon or germanium. The higher the value of n, the more completely the carbon or germanium is surrounded by a matrix of silicon atoms. Surrounding the carbon or germanium with a silicon matrix is desirable because it decreases the likelihood of forming undesirable bonds such as carbon-carbon or germanium-germanium bonds which might otherwise occur. It also reduces the occurrence of undesirable dangling carbon or germanium bonds.

In one preferred embodiment of the invention all of the X atoms are hydrogen (H). Hydrogen atoms, however, can be replaced in whole or in part with halogen atoms, i.e., fluorine (F), chlorine (Cl), bromine (Br) or iodine (I). In other words, one or more of the X atoms surrounding either the M or the M' atoms can be a halogen atom. Moreover, where more than one X atom is a halogen atom, the multiple halogen atoms can be the same or different halogens.

In another preferred embodiment one or more of the X atoms surrounding either the M or the M' atoms is fluorine. Good optical and electronic properties have been reported in the literature for fluorinated hydrogenated amorphous silicon alloys. The present invention provides a method of controlling the manner in which fluorine is incorporated into the hydrogenated amorphous silicon alloy by including it in the deposition feedstock material of the present invention thereby reducing the likelihood of forming undesirable chemical bonds. Where hydrogen is replaced entirely with fluorine or another halogen in the deposition feedstock material of the present invention, then the deposition gas mixture should preferably include another compound containing hydrogen such as silane ($SiH_4$) to ensure that there is at least some hydrogen in the resulting alloy.

In accordance with the present invention, if a low optical bandgap hydrogenated amorphous silicon alloy is desired, then M' in the above formula for the deposition feedstock material is preferably germanium. In a preferred low bandgap embodiment of the present invention M is silicon, X is hydrogen, fluorine or mixtures thereof and M' is germanium. Particularly preferred deposition feedstock materials of the present invention useful for forming low bandgap hydrogenated amorphous silicon germanium alloys are: monosilylgermane, $SiH_3GeH_3$, disilylgermane $(SiH_3)_2GeH_2$, trisilylgermane, $(SiH_3)_3GeH$, tetrasilylgermane $(SiH_3)_4Ge$, fluorosilylgermylsilane, $FSiH_2GeH_2SiH_3$ and tetra(trifluorosilyl)germane, $(SiF_3)_4Ge$. A representative but not exhaustive listing of applications for which low band-gap hydrogenated amorphous silicon alloys are useful include: xerography, laser printers, stacked junction solar cells and in the intrinsic (i-layer) and negatively doped (n-layer) regions of p-i-n type photovoltaic devices.

On the other hand, if a high optical bandgap hydrogenated amorphous silicon alloy is desired, then M' in the above formula for the deposition feedstock material is preferably carbon. In a preferred high bandgap embodiment of the present invention M is silicon, X is hydrogen, fluorine or mixtures thereof and M' is carbon. Particularly preferred deposition feedstock materials of the present invention useful for forming high bandgap hydrogenated amorphous silicon carbon alloy are: monosilylmethane $SiH_3CH_3$, disilylmethane, $(SiH_3)_2CH_2$, trisilylmethane $(SiH_3)_3CH$, tetrasilylmethane, $(SiH_3)_4C$, fluorosilylmethylsilane, $FSiH_2CH_2SiH_3$ and tetra(trifluorosilyl)methane, $(SiF_3)_4C$. A representative but not exhaustive listing of applications for which high band-gap hydrogenated amorphous silicon alloys are useful include: stacked junction solar cells and the positively-doped (P-layer) regions of p-i-n type photovoltaic devices.

A dopant material for use in the fabrication of negatively-doped hydrogenated amorphous silicon alloys in accordance with the present invention has the following formula:

$$(SiX_3)_m L X_{3-m} \qquad \text{II}$$

wherein L is a Group 5A atom selected from the group of phosphorus (P), arsenic (As), antimony (Sb) and bismuth (Bi), X is hydrogen, halogen or mixtures thereof, and m is an integer between 1 and 3, inclusive. Inclusion of such a dopant material in the deposition gas mixture during the deposition of a hydrogenated amorphous silicon alloy film onto a substrate in a deposition chamber permits greater control of the incorporation of the Group 5A atoms into the hydrogenated amorphous silicon alloy, thereby reducing the occurrence of undesirable chemical bonds.

The term Group 5a atom refers to an atom of an element of Group 5A of the Periodic Table.

In the preferred embodiments of the invention, the Group 5A atom is phosphorus or arsenic. The higher the value of m, the more completely the phosphorus or arsenic is surrounded by a matrix of silicon atoms. Surrounding the phosphorus or arsenic with a silicon matrix is desirable because it decreases the likelihood of forming undesirable bonds such as phosphorous-phosphorous or arsenic-arsenic bonds which might otherwise occur. It also reduces the occurrence of undesirable dangling phosphorus or arsenic bonds.

In one preferred embodiment of the invention all of the X atoms are hydrogen. Hydrogen atoms, however, can be replaced in whole or in part with halogen atoms, i.e., fluorine, chlorine, bromine or iodine. In other words, one or more of the X atoms surrounding either the Si or the Group 5A atoms can be a halogen atom. Moreover, where more than one X atom is a halogen atom, the multiple halogen atoms can be the same or different halogens.

In another preferred embodiment of the present invention, one or more of the X atoms surrounding either the Si or Group 5A atoms is fluorine. As explained above, good optical and electronic properties have been reported in the literature for fluorinated hydrogenated amorphous silicon alloys. The present invention provides a method of controlling the manner in which fluorine is incorporated into the hydrogenated amorphous silicon alloy by including it in the dopant material of the present invention thereby reducing the likelihood of forming undesirable chemical bonds.

In accordance with the present invention, particularly preferred dopant materials falling within formula II which are useful in the fabrication of negatively-doped hydrogenated amorphous silicon alloys are: trisilylphosphine $(SiH_3)_3P$ and trisilylarsine $(SiH_3)_3As$. In each of these preferred dopants, the Group 5A atom is completely surrounded by silicon atoms thereby minimizing the occurrence of undesirable phosphorus-phosphorus, arsenic-arsenic, dangling phosphorus or dangling arsenic bonds.

A dopant material for use in the fabrication of positively-doped hydrogenated amorphous silicon alloys in accordance with the present invention has the following formula:

$$YJX_2 \quad \text{III}$$

wherein Y is halogen or carbonyl, J is a Group 3A atom, and X is hydrogen, halogen or mixtures thereof.

The term "Group 3A atom" refers to an atom of an element of Group 3A of the Periodic Table, i.e., boron (B), aluminum (Al), gallium (Ga), indium (In) and thallium (Tl). In accordance with the preferred embodiments of the present invention, the Group 3A atom is boron, aluminum or gallium.

The term "halogen" is defined as above, i.e., fluorine, chlorine, bromine, or iodine. Either one or both X atoms can be halogen. When both X atoms are halogen, they may be the same or different halogens. Likewise when Y and one or both of the X atoms are halogen, the multiple halogen atoms may be the same or different halogens. Preferred dopant materials of formula III wherein Y is a halogen are: boron trifluoride $(BF_3)$, boron difluoride $(BHF_2)$, aluminum trichloride $(AlCl_3)$ and gallium trichloride $(GaCl_3)$.

The term carbonyl refers to a carbon and oxygen containing substituent of the formula: $-C=O$.

A preferred dopant material of formula III wherein Y is carbonyl is borane carbonyl $(BH_3CO)$.

Use of a formula III dopant material of the present invention, such as boron trifluoride, boron difluoride, aluminum trichloride, gallium trichloride or borane carbonyl, in the deposition of a positively-doped hydrogenated amorphous silicon alloy film on a substrate in a deposition chamber permits greater control of the incorporation of Group 3A atoms into the negatively-doped hydrogenated amorphous silicon alloy, thereby reducing the occurrence of undesirable chemical bonds such as boron-boron, aluminum-aluminum or gallium-gallium bonds.

In accordance with the present invention, hydrogenated amorphous silicon alloy is prepared by deposition of a hydrogenated amorphous silicon alloy film onto a substrate in a deposition chamber. During deposition, a deposition gas mixture, which includes one or more feedstock materials of the above formula I or one or more dopants of the above formula II or one or more dopants of the above formula III, is introduced into the deposition chamber.

The deposition feedstock materials of the above formula I can be used by themselves, with a dopant material of the present invention (formulas II or III) or with other commonly used deposition feedstock or dopant materials. In accordance with the preferred embodiments of the present invention, the deposition feedstock materials of the present invention (formula I) comprise between about 1% and 50% by volume of the deposition gas mixture, preferably between about 1% and 20% thereof.

The dopant materials of the above formulas II and III are always used with one or more deposition feedstock materials. The deposition feedstock material with which these dopant materials are used can be either deposition feedstock materials of the present invention or other commonly used deposition feedstock materials or combinations thereof. In accordance with the preferred embodiments of the present invention, the dopant materials of the present invention (formulas II or III) comprise between about 0.000001% and 1.0% by volume of the deposition gas mixture, preferably between about 0.001% and 1.0% thereof.

A representative but non-exhaustive list of other deposition feedstock and dopant materials that can be used with the deposition feedstock or dopant materials of the present invention include silane $(SiH_4)$, higher silanes such as disilane $(Si_2H_6)$ and trisilane $(Si_3H_8)$, germane $(GeH_4)$, higher germanes such as digermane $(Ge_2H_4)$, ammonia $(NH_3)$, hydrogen $(H_2)$, methane $(CH_4)$, phosphine $(PH_3)$, arsine $(AsH_3)$, diborane $(B_2H_6)$, fluorine $(F_2)$, arsenic pentafluoride $(AsF_5)$, nitrogen trifluoride $(NF_3)$, phosphorus pentafluoride $(PF_5)$ and phosphorus trifluoride $(PF_3)$.

Silane is a preferred additional deposition feedstock material for use with the deposition feedstock and/or dopant materials of the present invention because it is readily available in the relatively pure form which is necessary for semiconductor manufacture. While the present invention can be practiced with some contaminants, it is preferable to use deposition feedstock and dopant materials which are as pure as possible.

In a preferred embodiment of this invention, deposition is accomplished using a conventional glow discharge technique, such as D.C. glow discharge, R.F. glow discharge, A.C. glow discharge or microwave glow discharge. See, e.g., U.S. Pat. No. 4,064,521, the disclosure of which is incorporated by reference herein. Preferably, the deposition substrate temperature is between about 150° and 400° C., more preferably between about 220° and 260° C. Preferably, the deposition pressure is between about 0.1 and 10 torr, more preferably between about 0.5 and 1.0 torr. Preferably, the cathode current density is between about 0.01 and 3.0 ma/cm$^2$, more preferably between about 0.1 and 0.3 ma/cm$^2$.

Alternatively, other conventional deposition techniques can be used. These other deposition techniques include: chemical vapor deposition, photochemical vapor deposition, low pressure chemical vapor deposition, homogeneous chemical vapor deposition, sputtering and reactive sputtering in the presence of hydrogen.

Deposition of the hydrogenated amorphous silicon alloy film as described above can be promoted by activation of the deposition feedstock materials of the present invention by dehydrogenation or dehalogenation. Dehydrogenation or dehalogenation of the deposition feedstock materials of the present invention will lead to the formation of activated molecules or radicals that can readily bond to the surface of a growing film.

The activation of the deposition feedstock materials of the present invention can be accomplished by photochemical vapor deposition. This technique may be used to selectively break Si—H bonds without breaking other molecular bonds. This may be accomplished by conventional single or multi-photon processes and can also be accomplished by using conventional activated intermediates such as mercury (Hg).

Activation of the deposition feedstock materials of the present invention can also be accomplished by reaction with atomic hydrogen. Atomic hydrogen may be generated in a separate chamber by a plasma, hot filaments or catalytic activity in a conventionally known means and then injected into the deposition chamber containing the silyl compounds. This approach may require the use of gas flow isolation of the atomic hydrogen generation chamber to prevent the deposition feedstock materials of the present invention from diffusing into the generation chamber.

Activation of the deposition feedstock materials of the present invention can also be accomplished by catalytic dehydrogenation or dehalogenation in a conventionally known manner. For example, certain compounds or elements such as platinum (Pt) and palladium (Pd) are able to catalytically dehydrogenate certain hydrogen containing compounds.

Activation of the deposition feedstock materials of the present invention via dehydrogenation can also be accomplished via conventionally known reactions with molecular or atomic fluorine. That is, fluorine will react with some hydrogen-containing compounds to remove the hydrogen and form HF molecules.

Activation of the deposition feedstock materials of the present invention can also be accomplished via energetic electrons. The deposition system can be configured so that monoenergetic electrons are injected into the deposition atmosphere. The injection energy should be selected so that there is a high probability of breaking Si—H bonds or Si-halogen bonds and a low probability of breaking other bonds.

The above methods of activating the deposition feedstock materials of the present invention via dehydrogenation or dehalogenation will be applicable even if the deposition contains inert gases such as argon (Ar) or other deposition gases such as silane ($SiH_4$) disilane ($Si_2H_6$) or hydrogen ($H_2$). To promote dehydrogenation or dehalogenation the substrate is preferably heated to a temperature in the range of 150° to 400° C.

In a preferred embodiment of the present invention, activation of the deposition feedstock and dopant materials is accomplished by using mercury-sensitized photochemical vapor deposition. Preferably, deposition is carried out with a substrate temperature of between about 150° and 400° C., more preferably between about 220° and 260° C. The deposition pressure is preferably between about 0.1 and 50.0 torr, more preferably between about 1.0 and 10.0 torr. Before being introduced into the reactor, the deposition feedstock and dopant materials are diluted with hydrogen and pre-mixed with a very small amount of mercury vapor in a thermally controlled conventional mercury vaporizer. Ultraviolet light from a conventional low pressure mercury lamp is transmitted through a transparent window placed between the mercury lamp and the substrate. The ultraviolet light energy from the mercury lamp excites the mercury atoms which then activates the deposition feedstock and dopant materials by dehydrogenation or dehalogenation.

In accordance with the present invention, the hydrogenated amorphous silicon alloy film can be deposited on any suitable substrate. A representative but not exhaustive list of substrates suitable for use in practicing the present invention include conducting transparent oxides and stainless steel.

An improved semiconductor device made in accordance with the present invention comprises one or more hydrogenated amorphous silicon alloy regions made from either one or more feedstock materials of the above formula I, or one or more dopants of the above formula II or one or more dopants of the above formula III. Such a semiconductor device is prepared by depositing on a substrate, preferably by a glow discharge or a photochemical vapor deposition process, one or more hydrogenated amorphous silicon alloy regions, at least one of the regions being made by introducing into the deposition chamber during deposition a deposition gas mixture which includes either one or more feedstock materials of the above formula I, one or more dopants of the above formula II or one or more dopants of the above formula III. A representative but not exhaustive list of types of semiconductor devices which can be made in accordance with the present invention includes: photovoltaic devices, current rectifying devices, photodetectors, thin film resistors, and photoreceptors. As embodied herein, the preferred semiconductor device made in accordance with the present invention is a photovoltaic device.

A photovoltaic device in accordance with the present invention comprises a front contact, a back contact and one or more hydrogenated amorphous silicon regions between the front and back contacts, wherein at least one of the regions is a hydrogenated amorphous silicon alloy made by deposition, preferably by a glow discharge or a photochemical vapor deposition process, in a deposition chamber by introducing into the deposition chamber a deposition gas mixture which includes either one or more feedstock materials of the above formula I, or one or more dopants of the above formula II, or one or more dopants of the above formula III.

The term front contact refers to the contact on the light incident side of the photovoltaic device. The term back contact refers to the contact on the side opposite the light incident side of the photovoltaic device.

One embodiment of the present invention is illustrated in FIG. 1 (not to scale). As shown in FIG. 1, light (1) enters the light incident side of a photovoltaic cell. The light passes first through a glass layer (2), then through a transparent conductive layer (3), which serves as a front contact, and then into the hydrogenated amorphous silicon region (4). Lastly, on the side opposite the light incident side of the photovoltaic device is a metal back contact (5).

In FIG. 1 the hydrogenated amorphous silicon region (4) is a p-i-n junction. That is, the hydrogenated amorphous silicon region includes a positively doped layer (p-layer) (6), an intrinsic layer (i-layer) (7) and a negatively doped layer (n-layer) (8). A conventional hydrogenated amorphous silicon photovoltaic cell having a p-i-n junction of this same general form is shown, for example, in U.S. Pat. No. 4,217,148, the disclosure of which is incorporated by reference herein.

Alternatively, the hydrogenated amorphous silicon regions could take the form of other conventional semiconductor diode arrangements. A representative but not exhaustive list of other arrangements include: p-layer/n-layer; n-layer/i-layer/p-layer; and n-layer/p-layer. These arrangements, as well as Schottky barriers and stacked junctions can also form the hydrogenated amorphous silicon region (4) in a photovoltaic cell such as shown in FIG. 1.

The present invention is also particularly suitable for photovoltaic devices wherein the hydrogenated amorphous silicon region has a graded optical bandgap. By use of the deposition feedstock materials of the present invention, Group 4A atoms other than silicon can be incorporated into the hydrogenated amorphous silicon alloy. As explained above, these Group 4A atoms will affect the bandgap of the resulting hydrogenated amorphous silicon alloy layers. Thus, by using different deposition feedstock materials of the present invention in the deposition gas mixtures used to form different layers in the hydrogenated amorphous silicon region, a graded bandgap structure can be obtained.

The deposition feedstock materials of the present invention as set forth in formula I above can be synthesized by a number of different methods. One method of synthesizing these compounds is in a silent electric discharge (sometimes referred to as an ozonizer type of electric discharge).

Several researchers have prepared silylgermanes in small (mg) quantities by the action of a silent electric discharge upon a mixture of silane and germane. See T. D. Andrews and C. S. G. Phillips, "Further Studies on the Silicon-Germanium Hydrides," J.

CHEM. SOC.(A) (1966) pp. 46–48; S. D. Gokhale, J. E. Drake and W. L. Jolly, "Synthesis of the Higher Silanes and Germanes," J. INORG. NUCL. CHEM. (1965) Vol. 27, pp. 1911–1916; E. J. Spanier and A. G. MacDiarmid, "The Synthesis of Germylsilane from Silane and Germane in a Silent Electric Discharge," INORG. CHEM. (1963) Vol. 2, pp. 215–216.

Example 1 describes a similar, but scaled up, technique which was used to prepare several grams of monosilylgermane:

EXAMPLE 1

Approximately five grams of Airco ® CCD grade silane and six grams of Matheson ® germane were introduced into a conventional silent electric discharge reactor having a volume of 8.4 l. and a pressure of 525 torr. A conventional metal bellows pump recirculated the gas mixture through the reactor for three hours. A conventional cold trap, kept at $-90°$ C. by flowing nitrogen gas cooled by liquid nitrogen, trapped the silylgermanes while passing the unreacted silane and germane and the hydrogen product. The silane, germane, and hydrogen were pumped away and the collected, impure silylgermanes were distilled through a conventional cryogenic distillation column to purify the monosilylgermane. The purified monosilylgermane was analyzed using a conventional gas chromatograph-mass spectrometer. The only major impurity in the monosilylgermane was disilane at a level of 100 ppmw. All other higher order silanes, germanes, and silylgermanes were reduced to levels less than 1 ppmw. Occasionally, digermane was observed in some purified monosilylgermane samples at levels of 1–5 ppmw. After purification, the monosilylgermane was stored in a stainless steel cylinder.

Another suitable method for preparing deposition feedstock materials of the present invention is described in copending U.S. patent application Ser. No. 06/830,103, of Benjamin Frederick Fieselman, entitled "Preparation of Silicon and Germanium Hydrides containing Two Different Group 4A Atoms," filed concurrently herewith, the disclosure of which is incorporated herein. This patent application discloses a method for preparing a hydride containing at least two different Group 4A atoms, wherein at least one of the Group 4A atoms is silicon or germanium. First, a salt comprising a cation (e.g., potassium) coordinated to a macrocyclic compound (e.g., a crown ether such as 18-crown-6 and an anion (e.g., a silicon hydride such as $SiH_3-$ or a germanium hydride such as $GeH_3-$) is formed in a suitable solvent (e.g., distilled monoglyme). This salt is then reacted with a Group 4A halide (e.g., $SiH_3Cl$, $CH_3I$ or $CH_2Cl_2$). This patent application specifically reports the preparation of monosilylgermane, $SiH_3GeH_3$, monosilylmethane, $SiH_3CH_3$, and disilylmethane, $(SiH_3)_2CH_2$. Other deposition feedstock materials of the present invention can be made by this same process by employing different Group 4A halides or hydrides.

Another suitable method for preparing deposition feedstock materials of the present invention is the acid hydrolysis of an alloy of magnesium, silicon and a Group 4A element other than silicon. See, e.g., P. L. Timms, C. C. Simpson, and C. S. G. Phillips, "The Silicon-Germanium Hydrides," J. CHEM. SOC. (1964) 1467–1475 (Timms et al.); C. S. G. Phillips and P. L. Timms, "Some Applications of Gas Chromatography in Inorganic Chemistry," J. ANAL. CHEM. (April 1963) Vol. 35, No. 4, pp. 505–510. The following example reported in Timms et al. illustrates the preparation of certain feedstock materials suitable for use in the present invention by the acid hydrolysis of an alloy of magnesium, silicon and another Group 4A element (in this case germanium):

EXAMPLE 2

2 g of an alloy of nominal composition $Mg_{20}Si_9Ge$ was tamped into five 1 cm.$\times$1 cm. thin-walled aluminium-foil cylinders. During 15 min., the cylinders were added one by one to 200 ml. of hydrofluoric acid (10% w/w) in a polythene flask (1 l.), where the foil dissolved quickly, releasing the alloy into the acid.

Hydrogen was bubbled at 600 ml./min. into the flask to carry the hydrides through a drying tube, containing phosphorus pentoxide (ca. 20 g.), and into a trap cooled by liquid oxygen. The hydrogen was maintained for 40 min. after the addition of the alloy. A blow-off, operating at 12 cm. of mercury, avoided excessive pressures in the reaction flask, and the flushing hydrogen emerged into the atmosphere through a mercury bubbler and was burnt. The bulk of the monosilane and monogermane in the 150–200 mg. of hydrides formed was normally removed by warming the trap to $-80°$. The residual higher hydrides were then carried in a stream of hydrogen to one of the traps immediately before the g.l.c. columns.

The deposition feedstock materials of the present invention can also be made by pyrolysis. The following example reported in Timms et al. illustrates the preparation of certain deposition feedstock materials suitable for use in the present invention by the pyrolysis of a germane with a silane:

EXAMPLE 3

Hydrides were thermally cracked at 290–350° to give mainly simpler volatile fragments. One cracker was a Pyrex tube (5 cm.×4 mm.) packed with glass wool and heated electrically. Hydrides were passed through the tube in hydrogen or nitrogen streams with a residence time of about 1 sec., and volatile materials were trapped and then separated on a g.l.c. column (5 ft.×3 mm.) packed with 10% Silicone 702 on Celite operated at room temperature. Reproducible g.l.c. "cracking patterns" were obtained with samples larger than about 30 μg. Silicon-germanium hydrides were formed, by condensing a silane with a germane of similar boiling point in a trap before an 8 cm.×1 cm. Pyrex tube, which was packed with glass wool and heated to 350–370°. The hydrides were evaporated quickly from the trap to pass through the tube with a residence time of 0.3–0.6 sec. in a hydrogen stream, the products being trapped and separated by g.l.c.

Another method of synthesizing deposition feedstock materials suitable for use in the present invention is described in J. A. Morrison and J. M. Bellama, "Synthesis and Characterization of the (Halosilyl) methylsilanes", J. ORGANOMETALLIC CHEMISTRY, 92 (1975) pp. 163–168 (Morrison et al.).

Example 4 describes a scaled up version of Morrison et al.'s technique which was used to prepare several grams of disilylmethane:

EXAMPLE 4

93.3 gm of Aldrich Gold Label ® tri-n-butyl amine, 29.1 gm of chloroform ($CHCl_3$) distilled and dried free of ethanol and 165 gm of Petrarch ® $SiHCl_3$ were mixed and stirred for one hour without heating. The mixture was then refluxed with cooling in a 500 ml. flask with a conventional $CaCl_2$ drying tube attached. After about one hour heat was added to keep the mixture at a constant reflux. The temperature of the reflux rose from 30° C. to 45° C. The mixture was refluxed for a total of 12 hours. The $CaCl_2$ drying tube was replaced with a conventional $N_2$ bubbler so that when the system cooled it filled with nitrogen. The mixture was allowed to cool overnight. The mixture was then decanted twice with heptane at −7° C. to −8° C. The heptane was removed at −10° C. with a conventional rotary evacuator. The residue was dissolved in 150–200 ml of Aldrich Gold Label ® n-butyl ether under $N_2$. Then $LiAlH_4$ was added slowly over 1–2 hours. Product was continuously separated under vaccuum.

Morrison et al. also describe the preparation of chloro-, bromo-, and iodosilyl) methylsilanes, i.e., $ClSiH_2CH_2SiH_3$, $BrSiH_2CH_2SiH_3$ and $FSiH_2CH_2SiH_3$. Example 5 is taken from Morrison et al.:

EXAMPLE 5

A small amount of the appropriate aluminum halide was sublimed onto the walls of a one liter vessel. Disilylmethane and hydrogen halide in a 3/1 molar ratio were vacuum distilled into the vessel, and the reagents were allowed to react at room temperature for one hour. The contents of the flask were then distilled. Hydrogen was removed, and material which passed a −95° trap (unreacted $(SiH_3)_2CH_2$ and a small amount of HX where x is a halogen) was returned to the reaction vessel with enough HX to reconstitute a 3/1 molar ratio. This process was repeated until most of the disilylmethane had been consumed. The combined condensates from the −95° trap were then distilled from a low-temperature still.

Morrison et al. also describe the preparation of fluorosilyl methylsilane, $FSiH_2CH_2SiH_3$. Example 6 is taken from Morrison et al.:

EXAMPLE 6

Fluorosilylmethylsilane was prepared by the reaction of bromosilylmethylsilane with lead(II) fluoride. Two grams of freshly prepared $PbF_2$ and a stirring bar were placed into a 200 ml flask which was then evacuated. Bromosilylmethylsilane, 0.95 g (6.1 mmol) was distilled into the vessel and allowed to react at room temperature. After two hours the volatile contents of the flask were condensed into a low temperature still from which 0.30 g $FSiH_2CH_2SiH_3$ (3.2 mm 51% yield) was collected at −109° C.

Another method of synthesizing deposition feedstock materials of the present invention is described in R. A. Benkeser, J. M. Gaul and W. E. Smith, "Silylation of Organic Halides. A New Method of Forming the Carbon-Silicon Bond," J. AMERICAN CHEMICAL SOCIETY, 91:13, June 18, 1969, pp. 3666–7 (Benkeser et al.). Example 7, taken from Benkeser et al., describes the preparation of hexachlorodisilylmethane $(SiCl_3)_2CH_2$.

EXAMPLE 7

A mixture of 1 mole of chloroform, $CHCl_3$, 4.5 moles of trichlorosilane, $SiHCl_3$, and 3 moles of tri-n-propylamine were refluxed at 56°–65° C. for 16 hours in the presence of $CH_3CN$ to form hexachlorodisilylmetane, $(SiCl_3)_2CH_2$.

Example 8 illustrates hydrogenated amorphous silicon alloy films made in accordance with the present invention using monosilylgermane as a deposition feedstock material:

EXAMPLE 8

Hydrogenated amorphous silicon germanium alloy films were prepared using a conventional DC proximity glow discharge deposition system and a deposition gas mixture which included the monosilylgermane synthesized by the method disclosed in Example 1. Typically, the best films were prepared at a substrate temperature of 220° C., a total gas pressure of 0.5 torr, and a cathode current density of 0.09 ma/cm$^2$. To change the germanium content in the deposited films, the flow rate of monosilylgermane was varied from 0 to 50 standard cubic centimeters per minute (SCCM). Silane was simultaneously added to make the total flow rate 100 SCCM during the deposition.

Figure 2:
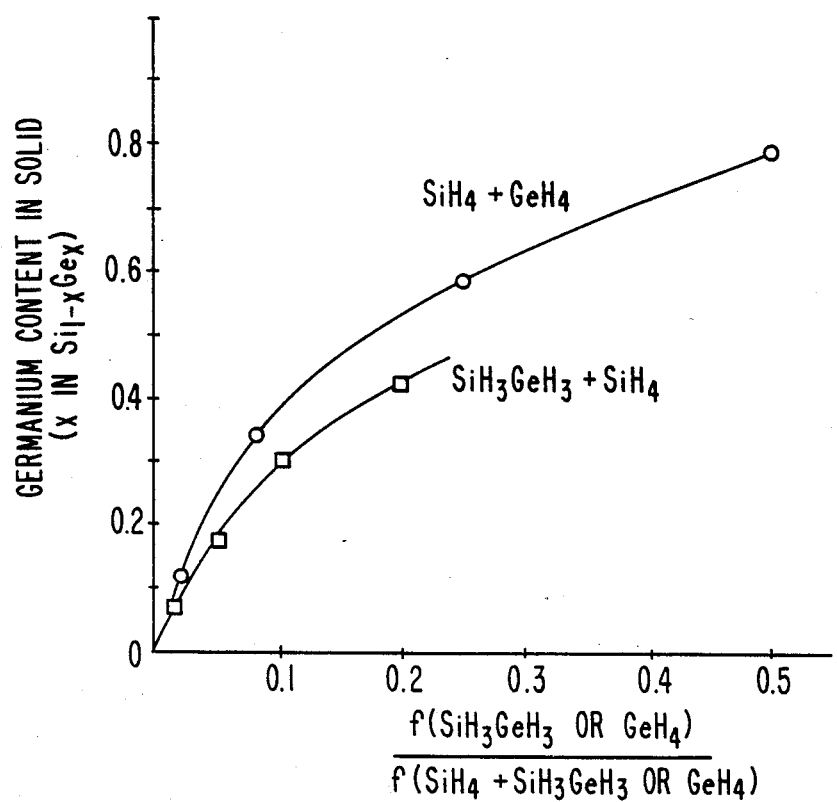
FIG. 2 is a graph plotting the germanium content of hydrogenated amorphous silicon germanium alloy films made by deposition of gas mixtures containing (1) silane and germane and (2) silane and monosilylgermane.

To determine the germanium content in the silicon germanium films, a relative atomic ratio was measured with an electron microprobe technique using an ISI super III SEM and a KEVEX ® Model 5100 X-ray spectrometer. FIG. 2 compares the incorporation rate of germanium in the silicon germanium alloys prepared from monosilylgermane and germane each mixed with various amounts of silane. The curve is parabolic for both, indicating a similar germanium incorporation mechanism. However, less germanium is incorporated into the solid films for a given mole fraction of germanium feedstock in the gas phase when monosilylgermane was used. This is an expected result because more silicon atoms are present in a gas phase mixture of monosilylgermane and silane than for an equivalent silane and germane mixture.

To characterize the hydrogenated amorphous silicon germanium alloys, thin films 3000Å thick were prepared with various amounts of monosilylgermane and silane. Samples for optical measurements were deposited on quartz substrates, while samples for conductivity measurements were deposited on quartz substrates having chrome strips for four point probe measurements.

The optical bandgaps were determined from optical absorption measurements using the Tauc relation $\alpha h\gamma = C(h\gamma - E_o)^2$, where $E_o$ in eV is the optical bandgap, C is the Tauc coefficient in $\mu m^{-1} ev^{-1}$, $h\gamma$ is the absorbing photon energy in eV, and $\alpha$ is the absorption coefficient in $\mu m^{-1}$. Light (AM1) and dark conductivity were determined by a high impedance four point probe DC measurement.

Figure 3:
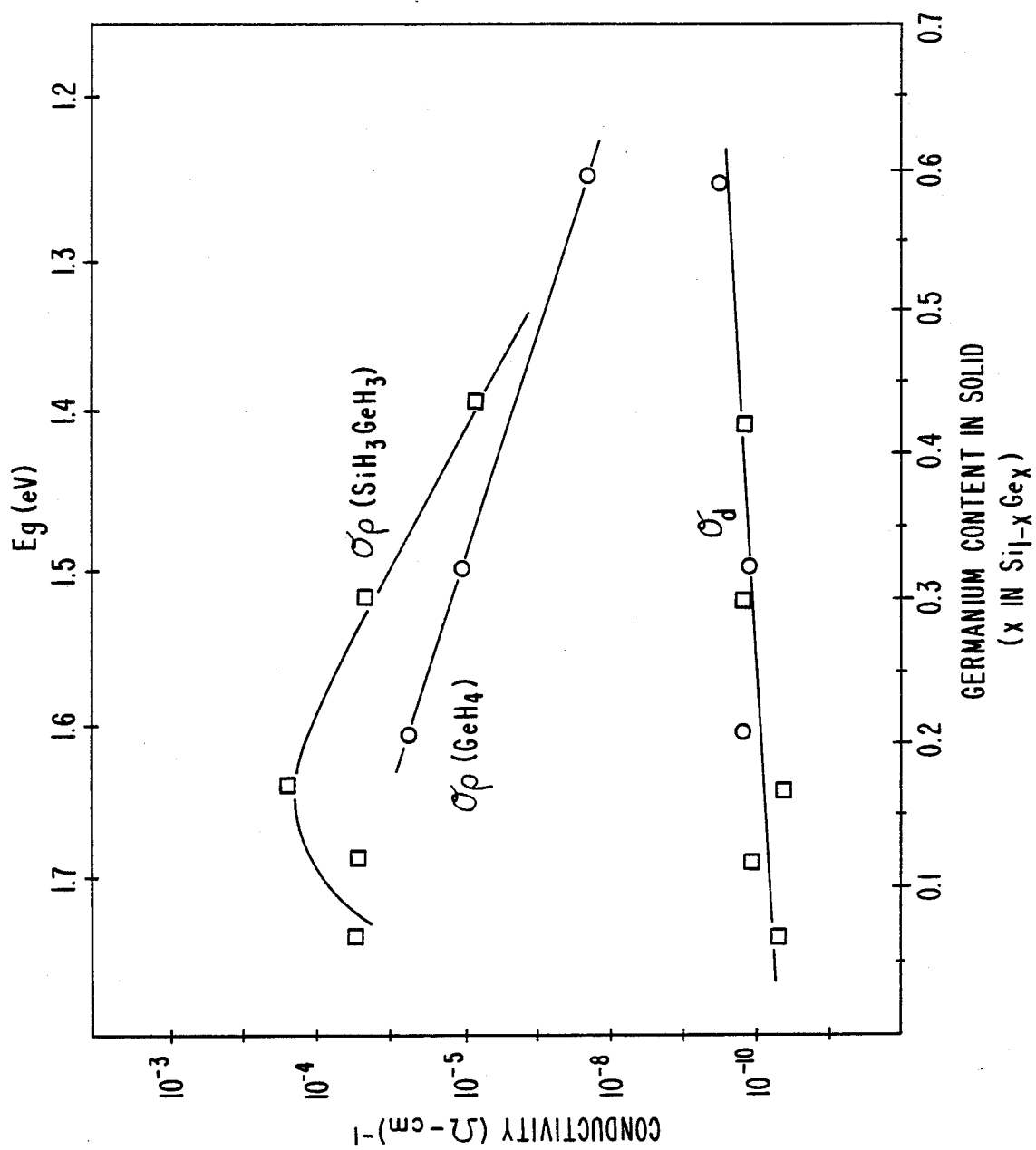
FIG. 3 is a graph plotting the light and dark conductivity as a function of germanium content for hydrogenated amorphous silicon germanium alloy films made by deposition of gas mixtures containing (1) silane and germane and (2) silane and monosilylgermane.

FIG. 3 plots the light and dark conductivity as a function of the germanium content (x in $Si_{1-x}Ge_x$) in the solid film for alloys made from mixtures of silane and monosilylgermane and for alloys made from mixtures of silane and germane. The dark current (low $10^{-10}\Omega^{-1}cm^{-1}$) as a function of x is nearly the same for both hydrogenated amorphous silicon germanium alloys, indicating good semiconductor electrical properties. However, the light conductivity decreases quickly as the germanium content increases in the hydrogenated amorphous silicon germanium alloys made from silane and germane. For bandgaps smaller than 1.6 eV, the photoconductivity of the hydrogenated amorphous silicon germanium alloys made using monosilylgermane and silane is an order of magnitude better than the hydrogenated amorphous silicon germanium alloys made using silane and germane. This is important because the better the photoconductivity the better the transport properties of the solar cell.

The superiority of silicon germanium alloys made from monosilylgermane as illustrated in FIG. 3 is likely due to a reduction in dangling bonds on germanium.

$_3$GeH, or tetrasilylgermane, $(SiH_3)_4Ge$, were used as deposition feedstock materials in the deposition gas mixture to deposit silicon germanium alloys. In this way, germanium dangling bonds would be reduced or eliminated and superior hydrogenated amorphous silicon germanium alloys formed.

Example 9 illustrates photovoltaic devices made in accordance with the present invention.

EXAMPLE 9 p-i-n type photovoltaic devices such as is illustrated in FIG. 1, were fabricated using the hydrogenated amorphous silicon germanium alloy films prepared by the method disclosed in Example 8.

The control cell for comparison in these experiments consisted of an a-SiC:H p-layer 100Å thick, a 5200Å thick i-layer of a-Si:H, and a 500Å thick a-Si:H n-layer.

The test cells had a structure consisting of an a-SiC:H p-layer 100Å thick, a 2500Å thick i-layer of a-Si:H, a 2500Å thick i-layer of a-SiGe:H and a 500Å thick a-SiGe:H n-layer. Both the 2500Å thick a-SiGe:H i-layer and the 500Å thick a-SiGe:H n-layer were made by the method disclosed in example 8 using monosilylgermane (prepared in Example 1) and silane in the deposition gas mixture.

The substrate temperature was 240° C. during deposition for the control cell. The hydrogenated amorphous silicon germanium alloys were deposited at a substrate temperature of 220° C.

All solar cells were deposited on 10Ω/□ conductive fluorinated tin oxide (CTO) front contact substrates. The p-i-n diodes were completed with a 20Å/Ti and 3500Å Ag back contact metallization. Individual small test cells having areas of 0.3 cm² were defined by a mask during metal deposition. The substrate temperature for test cells was 240° C. except during the deposition of the Si—Ge alloys where the substrate temperature was lowered to 220° C.

The characteristics of the fabricated solar cells are summarized in Table I. The measurements were made using AM1.5 illumination at 100 mW/cm².

TABLE I

| | Characteristics of Amorphous Silicon Germanium Solar Cells Fabricated With Monosilylgermane | | | | | |
|---|---|---|---|---|---|---|
| Deposition Gas Mixture Used in Preparation of i-layer | Bandgap of Solid Phase Composition of i-layer | Efficiency in Converting Solar Energy to Electrical Energy (%) | Fill Factor | Short Circuit Current Jsc (ma/cm²) | Open Circuit Voltage Voc (v) | Collection Length Lc/L at 700 nm |
| SiH$_4$ | 1.72eV a-Si:H | 10.24 | 0.759 | 15.73 | 0.857 | 25 |
| 5% SiH3GeH3 + 95% SiH4 | 1.73ev a-Si:H/ 1.59eV a-SiGe:H | 9.53 | 0.700 | 15.99 | 0.852 | 14 |
| 10% SiH3GeH3 + 90% SiH4 | 1.72ev a-Si:H/ 1.52ev a-SiGe:H | 7.25 | 0.604 | 15.24 | 0.782 | 4 |

Using monosilylgermaneone, one silicon atom is chemically bonded to the germanium atom prior to deposition. It is well known that many species are formed in a silane (and germane) glow discharge. However, the probability of forming SiH$_3$GeH$_2$— groups is greater than GeH$_3$GeH$_2$— groups because the Ge—H bond is weaker than the Si—H bond and because the germyl group is larger than the silyl group. This means a reduction (but not an elimination) of germanium dangling bonds. Similarly, it is expected that H$_2$Ge— and Ge—Ge bonds would be minimized in the solid film if disilylgermane, (SiH$_3$)$_2$GeH$_2$, trisilylgermane, (SiH$_3$)-

The fill factor of the tested solar cells decreases with increasing incorporation of germanium into the i-layer. Device fabrication produced solar cells having an efficiency of 9.53% for a hydrogenated amorphous silicon germanium alloy having Eg (bandgap)=1.59 eV and 7.25% for a hydrogenated amorphous silicon germanium alloy having Eg=1.52 eV.

Figure 4:
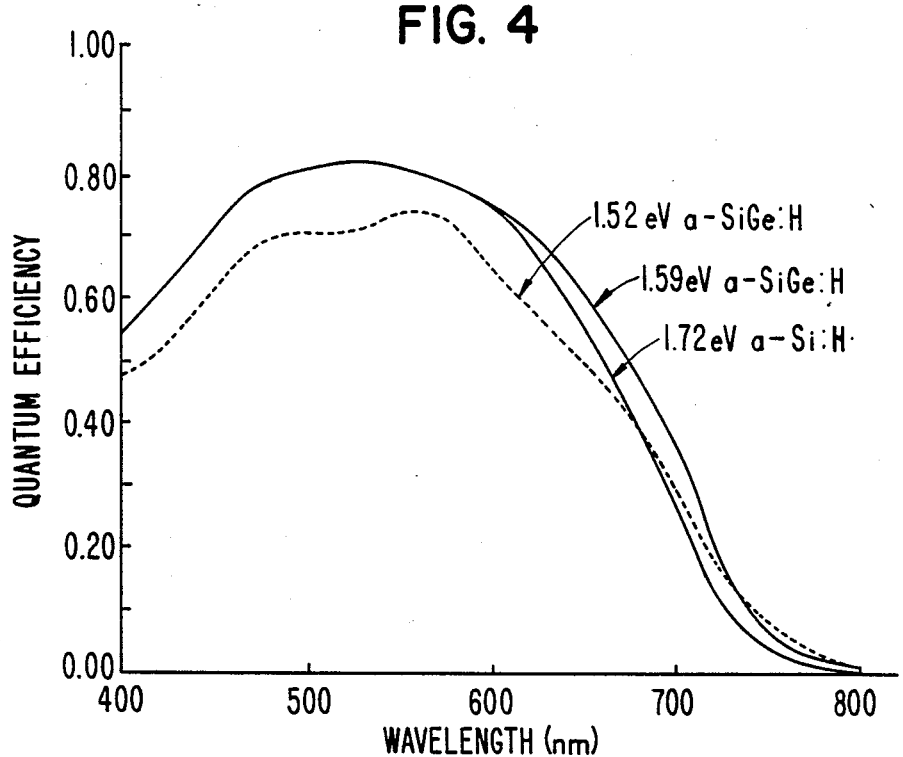
FIG. 4 is a graph plotting the quantum efficiency as a function of the light wavelength for (1) a conventional photovoltaic device having hydrogenated amorphous silicon i- and n- layers and (2) photovoltaic devices made in accordance with the present invention having hydrogenated amorphous silicon germanium -i- and -n- layers made with monosilylgermane as the germanium source.

FIG. 4 shows the quantum efficiency as a function of the light wavelength of the fabricated solar cells listed in Table I. The data used to plot FIG. 4 is reported in Table II:

TABLE II

| (nm) | Quantum Efficiency | | |
|---|---|---|---|
| | 1.72ev a-Si:H | 1.59ev a-SiGe:H | 1.52ev a-SiGe:H |
| 600 | 0.726 | 0.742 | 0.705 |
| 620 | 0.687 | 0.714 | 0.642 |
| 640 | 0.609 | 0.648 | 0.564 |
| 660 | 0.506 | 0.563 | 0.472 |
| 680 | 0.387 | 0.452 | 0.381 |
| 700 | 0.285 | 0.345 | 0.321 |
| 720 | 0.168 | 0.219 | 0.231 |
| 740 | 0.074 | 0.108 | 0.132 |
| 760 | 0.032 | 0.054 | 0.071 |
| 780 | 0.015 | 0.025 | 0.038 |
| 800 | 0.006 | 0.011 | 0.018 |

The solar cell fabricated with 1.59 eV a-SiGe:H alloy showed an improved red response with no effect on the blue response of the solar cell when compared to the control. This is also observed as a slight increase in the short circuit current $J_{sc}$. However, the solar cell fabricated with a 1.52 eV a-SiGe:H alloy showed a slight increase in the red response but an overall decrease in the blue and mid-bandgap absorption regions. This is reflected in the cell performance by a decrease in the short circuit current.

It is also observed in Table I that the fill factor decreases with increasing germanium incorporation. An excellent fill factor of 0.70 was measured for the cell fabricated with 1.59 eV a-SiGe:H alloy. However, for the solar cell fabricated with a 1.52 eV a-SiGe:H alloy the fill factor decreased to value of 0.60 which is satisfactory. The fill factors are decreasing because of the deterioration of the material transport properties with increasing germanium incorporation into the deposited alloy films.

Figure 5:
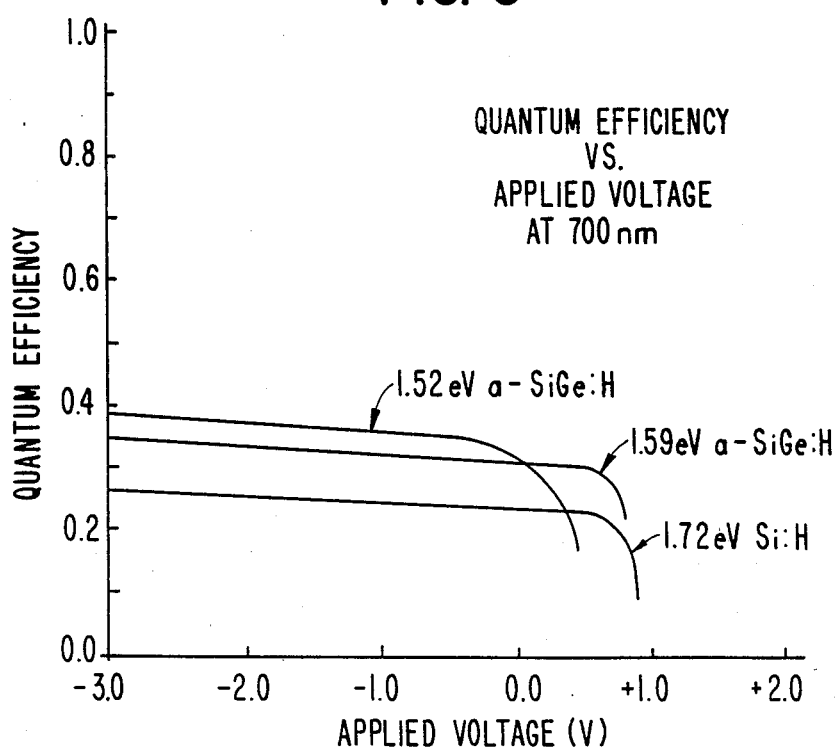
FIG. 5 is a graph plotting the quantum efficiency as a function of the applied voltage at 700 nm for (1) a conventional photovoltaic device having hydrogenated amorphous silicon i- and n- layers and (2) photovoltaic devices made in accordance with the present invention having hydrogenated amorphous silicon germanium i- and n- layers made with monosilylgermane as the germanium source.

The quantum efficiency as a function of the applied voltage at 700 nm for the solar cells listed in Table I under reverse bias conditions is displayed in FIG. 5. It is observed in this figure that all of the carriers generated at a reverse bias of −2.0 V are collected at 0.0 V bias condition (normal solar cell operation) for the control cell and for the 1.59 eV a-SiGe:H alloy solar cell. However, not all the charge carriers produced under −2.0 V reverse bias conditions are collected under 0.0 V bias conditions for the 1.52 eV a-SiGe:H alloy solar cell. This results in a dramatic decrease in collection length from $l_c/L$ value of 24 to an $l_c/L$ value of 4 at 400 nm. Hence, there is a corresponding reduction in fill factor.

Example 10 illustrates the superiority of hydrogenated amorphous silicon alloy films made in accordance with the present invention using disilylmethane as a deposition feedstock material.

EXAMPLE 10

Hydrogenated amorphous silicon carbon alloy p-layers were prepared using a conventional DC proximity glow discharge deposition system. The p-layers were deposited on $\frac{1}{2}''\times 3''$ quartz slides upon which chrome stripes had been previously evaporated. The chrome stripes were used to make electrical contacts with four point DC conductivity (resistivity) test apparatus. Generally, the thickness of the films were 2000–4000Å thick.

For the control (comparison) p-layers, the deposition gas mixture included either methane ($CH_4$), silane ($SiH_4$), and diborane ($B_2H_6$) or just silane and diborane.

For the p-layers made in accordance with the present invention, the deposition gas mixture included disilylmethane, $(SiH_3)_2CH_2$, (synthesized by the method disclosed in Example 4), silane, and diborane.

The flow rates of these deposition gases were varied to change the carbon contents in the deposited p-layers. Total flow rate was kept at 100 SCCM and the amount of diborane was kept constant at $1.83 \times 10^{-3}$ parts (0.18%) by volume of the total deposition gas mixture. The p-layers were prepared at a substrate temperature of about 220° C., a total gas pressure of 0.5 torr, and a cathode current density of 0.14 ma/cm². The time of deposition was altered to accommodate variations in deposition rate so that the resulting p-layers were within the 2000–4000Å range.

Table III summarizes the results obtained from measuring the resulting p-layers. Bandgaps were measured using the Tauc relation $\alpha h\gamma = C(h\gamma - E_o)^2$ and optical absorption measurements.

TABLE III

| Run # | Composition of Deposition Gas Mixture | Bandgap Eg (e V) | Resistivity (Ω-CM) |
|---|---|---|---|
| 1 | 12 SCCM 1½% $B_2H_6$ in $SiH_4$<br>88 SCCM $SiH_4$ | 1.89 | $1.94 \times 10^5$ |
| 2 | 3 SCCM $(SiH_3)_2CH_2$<br>12 SCCM 1½% $B_2H_6$ in $SiH_4$<br>85 SCCM $SiH_4$ | 1.96 | $1.55 \times 10^5$ |
| 3 | 5 SCCM $(SiH_3)CH_2$<br>12 SCCM 1½% $B_2H_6$ in $SiH_4$<br>83 SCCM $SiH_4$ | 2.04 | $4.83 \times 10^5$ |
| 4 | 6 SCCM $(SiH_3)_2CH_2$<br>12 SCCM 1½% $B_2H_6$ in $SiH_4$<br>82 SCCM $SiH_4$ | 2.09 | $1.51 \times 10^6$ |
| 5 | 9 SCCM $(SiH_3)_2CH_2$<br>12 SCCM 1½% $B_2H_6$ in $SiH_4$<br>79 SCCM $SiH_4$ | 2.13 | $4.48 \times 10^6$ |
| 6 | 12 SCCM 1½% $B_2H_6$ in $SiH_4$<br>88 SCCM $SiH_4$ | 1.89 | $1.85 \times 10^5$ |
| 7 | 25 SCCM $CH_4$<br>12 SCCM 1½% $B_2H_6$ in $SiH_4$<br>63 SCCM $SiH_4$ | 1.99 | $1.64 \times 10^5$ |
| 8 | 50 SCCM $CH_4$<br>12 SCCM 1½% $B_2H_6$ in $SiH_4$<br>38 SCCM $SiH_4$ | 2.15 | $2.04 \times 10^7$ |

The bandgap for the hydrogenated amorphous silicon film containing no carbon was 1.89 eV. Usually, however, the bandgap for such films are 1.72 eV. The higher bandgaps were obtained in this example because the deposition occurred at about 220° C. instead of the preferred temperature of 240° C. Thus, the resistivities measured from the p-layers made in this example are approximately a factor of ten times higher than they would have been had the preferred 240° C. deposition temperature been used.

Figure 6:
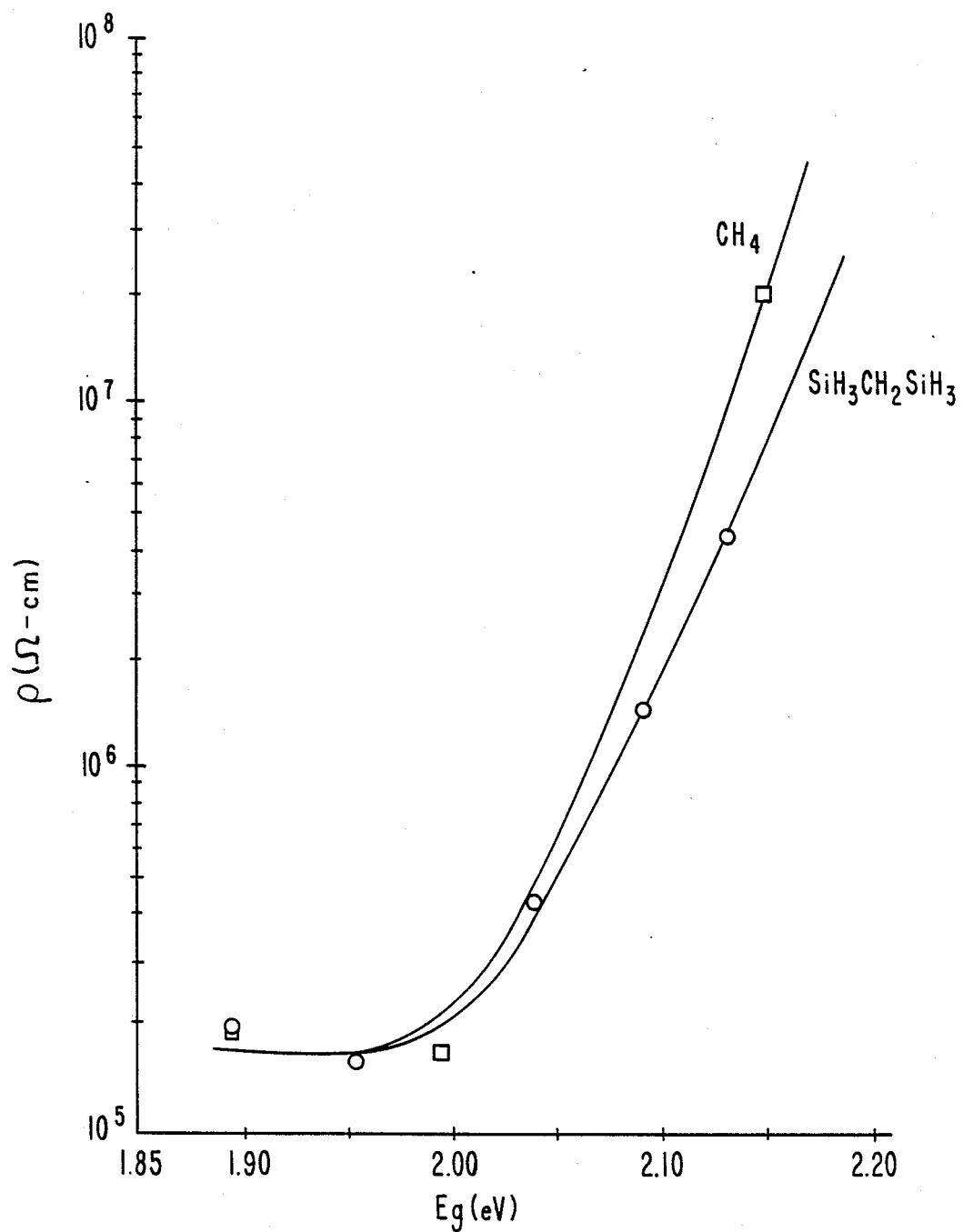
FIG. 6 is a graph plotting resistivity ($\rho$) as a function of the optical bandgap for (1) p-layers made in accordance with the present invention using disilylmethane (SiH$_3$CH$_2$SiH$_3$) as the source of carbon and (2) conventional p-layers made with methane (CH$_4$) as the carbon source.

FIG. 6 plots the resistivity as a function of bandgap for the p-layers summarized in Table III. FIG. 6 illustrates that p-layers made in accordance with the teachings of the present invention using disilylmethane as the carbon source have lower resistivities for a given bandgap than p-layers made with methane as the carbon source.

Example 11 illustrates the superiority of photovoltaic devices made in accordance with the present invention wherein disilylmethane is used as a deposition feedstock material in the deposition gas mixture to form the p-layer of the photovoltaic device.

EXAMPLE 11

P-i-n type photovoltaic devices, including a control device and test devices made in accordance with the present invention, were fabricated with a hydrogenated amorphous silicon carbon p-layer approximately 100Å thick.

The p-layers were deposited in a D.C. glow discharge using a cathode current density of 0.14 ma/cm$^2$, a substrate temperature of 220° C., and a total gas pressure of 0.5 torr.

In the control device, the deposition gas mixture for forming the p-layer was 50 SCCM CH$_4$, 12 SCCM 1½% B$_2$H$_6$ in SiH$_4$ and 38 SCCM SiH$_4$.

In the test devices made in accordance with the present invention, the deposition gas mixture for forming the p-layer was 9 SCCM (SiH$_3$)$_2$CH$_2$, 12 SCCM 1½% B$_2$H$_6$ in SiH$_4$ and 79 SCCM SiH$_4$.

Both devices had similar 5200Å hydrogenated amorphous silicon i-layers deposited in the D.C. glow discharge using a cathode current density of 0.14 ma/cm$^2$, a substrate temperature of 220° C., a total gas pressure of 0.5 torr. and a flow rate of 120 SCCM SiH$_4$.

Both devices had similar 500Å hydrogenated amorphous silicon n-layers deposited in the D.C. glow discharge using a cathode current density of 0.12 ma/cm$^2$, a substrate temperature of 220° C., a total gas pressure of 0.5 torr, and a flow rate of 12 SCCM 4% PH$_3$ in SiH$_4$ and 88 SCCM SiH$_4$.

Both devices had similar 20Å Ti/3500Å Ag back contacts, and similar 10Ω/☐ conductive transparent oxide (i.e., fluroinated tin oxide) front contacts.

Figure 7:
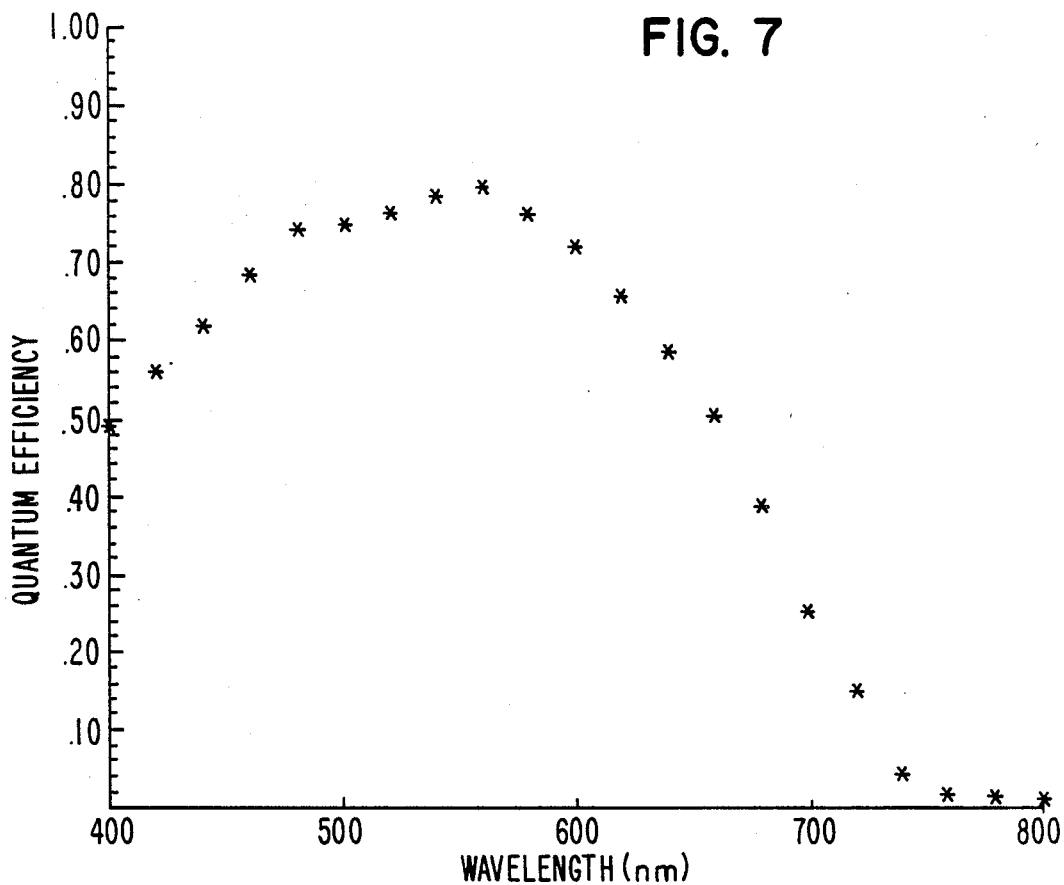
FIG. 7 is a graph plotting the quantum efficiency as a function of the light wavelength for a conventional photovoltaic device having a hydrogenated amorphous silicon carbon alloy p-layer made with methane as the carbon source.
Figure 8:
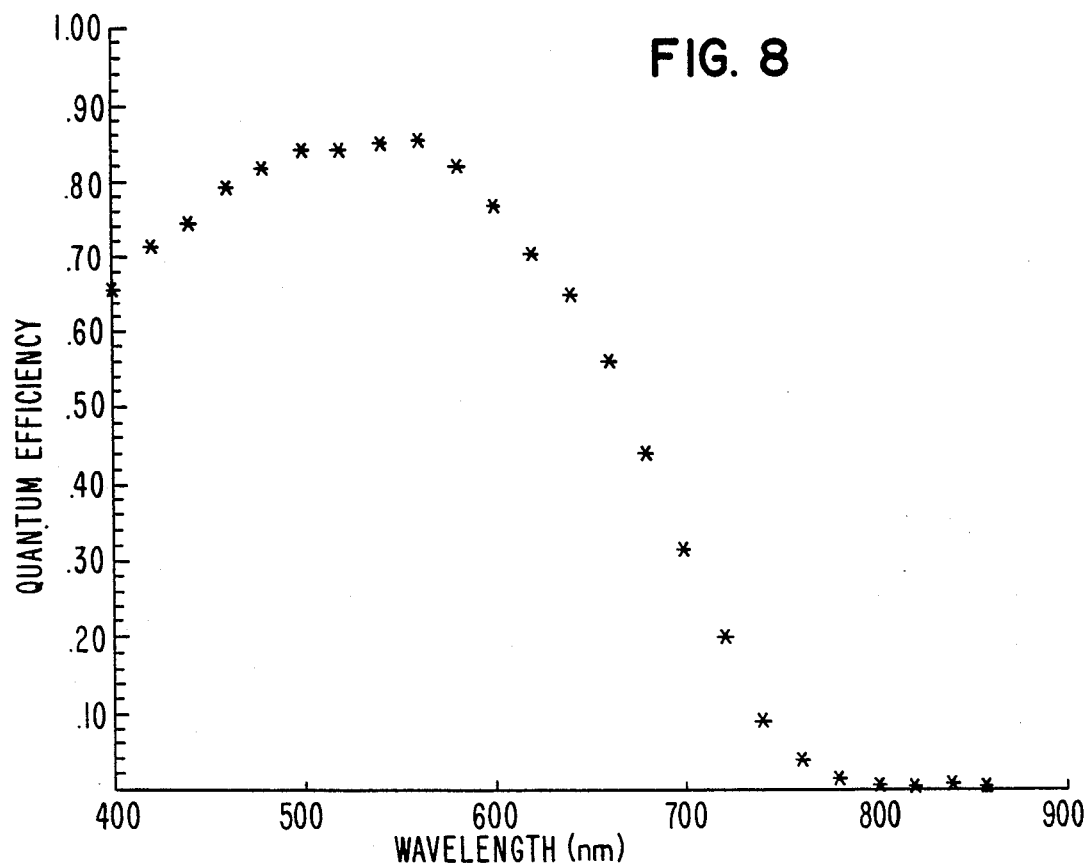
FIG. 8 is a graph plotting the quantum efficiency as a function of the light wavelength for a photovoltaic device having a hydrogenated amorphous silicon carbon alloy p-layer made in accordance with the present invention with disilylmethane as the carbon source.

FIG. 7 plots the quantum efficiency as a function of the light wavelength for the control device wherein methane is used as the carbon source for fabricating the p-layer. FIG. 8 plots the quantum efficiency as a function of the light wavelength for the best test device made in accordance with the present invention using disilylmethane as the carbon source. The data used to plot FIGS. 7 and 8 are reported in Table IV:

TABLE IV

| b light wavelength (nm) | Quantum Efficiency 2.13eV a-SiCiH (SiH$_3$)$_2$CH$_2$ used as carbon source | 2.15eV a-SiCiH CH$_4$ used as carbon source |
|---|---|---|
| 400 | 0.653 | 0.491 |
| 420 | 0.711 | 0.563 |
| 440 | 0.743 | 0.618 |
| 460 | 0.789 | 0.684 |
| 480 | 0.815 | 0.742 |
| 500 | 0.837 | 0.746 |
| 520 | 0.839 | 0.762 |
| 540 | 0.848 | 0.788 |
| 560 | 0.852 | 0.798 |
| 580 | 0.815 | 0.764 |
| 600 | 0.765 | 0.722 |
| 620 | 0.702 | 0.657 |
| 640 | 0.646 | 0.590 |
| 660 | 0.562 | 0.507 |
| 680 | 0.441 | 0.387 |
| 700 | 0.311 | 0.252 |
| 720 | 0.198 | 0.150 |

TABLE IV-continued

| b light wavelength (nm) | Quantum Efficiency 2.13eV a-SiCiH (SiH$_3$)$_2$CH$_2$ used as carbon source | 2.15eV a-SiCiH CH$_4$ used as carbon source |
|---|---|---|
| 740 | 0.091 | 0.041 |
| 760 | 0.038 | 0.016 |
| 780 | 0.013 | 0.006 |
| 800 | 0.003 | 0.001 |

Figure 9:
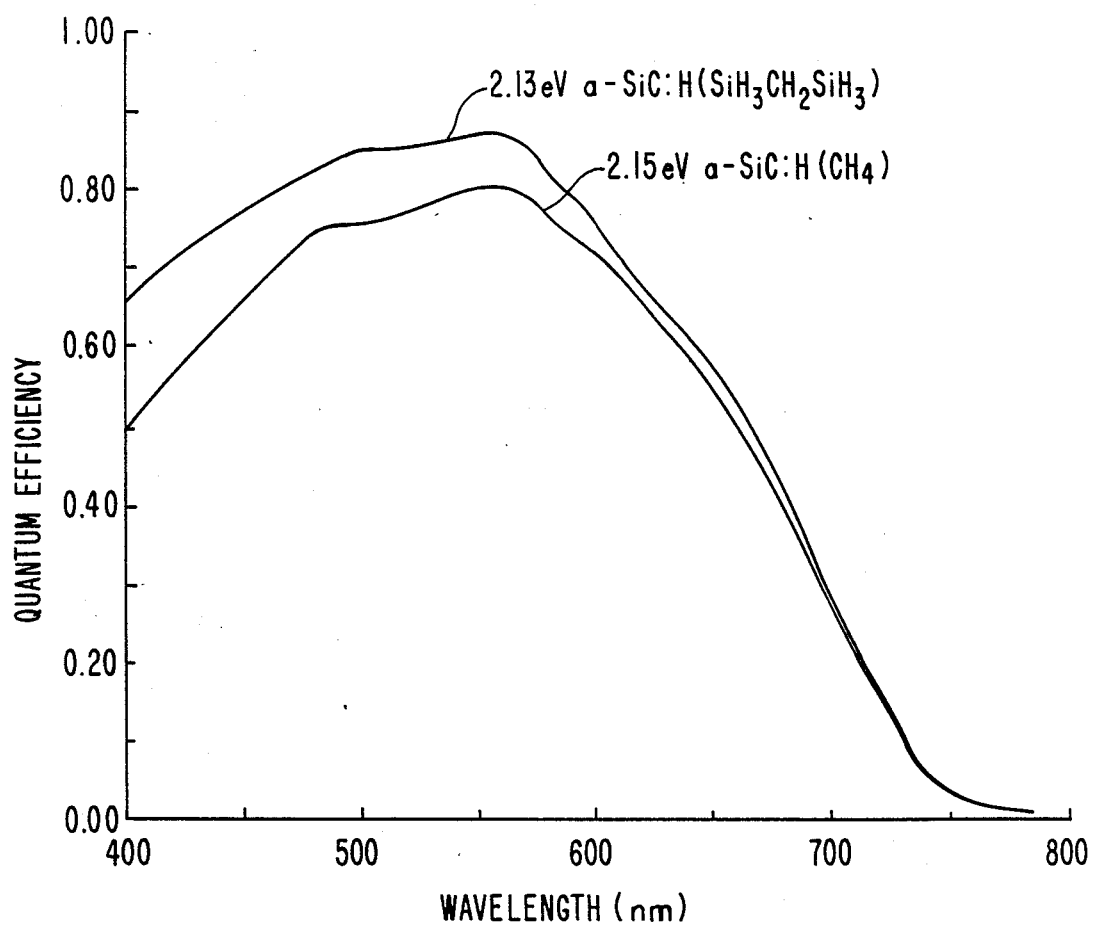
FIG. 9 is a superimposition of the graphs of FIGS. 7 and 8.

FIG. 9 superimposes the plots of FIGS. 7 and 8. As is illustrated therein, the quantum efficiency of the solar cell at a light wavelength of 400 nm increases from less than 50% efficient for the control solar cell made with methane as the carbon source to greater than 65% efficient for the solar cell made in accordance with the present invention using disilylmethane as the carbon source. This is a substantial improvement in the blue response of the solar cell.

Table V reports other data measured for the control and test solar devices of Example 11. This data illustrates the superiority of solar cells made in accordance with the present invention using disilylmethane as the source of carbon in the deposition gas mixture.

TABLE V

| | Deposition Feedstock Materials Used To Form p-layer* | Bandgap of α-SiC:H p-layer* | Efficiency in Converting Solar Energy to Electrical Energy (%) | Fill Factor | Short Circuit Current Jsc (ma/cm$^2$) | Open Circuit Voltage Voc (v) |
|---|---|---|---|---|---|---|
| CONTROL | 50% CH$_4$ 50% SiH$_4$ | 2.15 | 9.09 | 0.727 | 15.06 | 0.829 |
| RUN #1 | 8.9% SiH$_3$CH$_2$SiH$_3$ 91.1% SiH$_4$ | 2.13 | 9.32 | 0.700 | 16.61 | 0.802 |
| RUN #2 | 8.9% SiH$_3$CH$_2$SiH$_3$ 91.1% SiH$_4$ | 2.13 | 9.92 | 0.742 | 15.76 | 0.848 |

*Deposition gas mixture also included 0.18% of B$_2$H$_6$.

Figure 10:
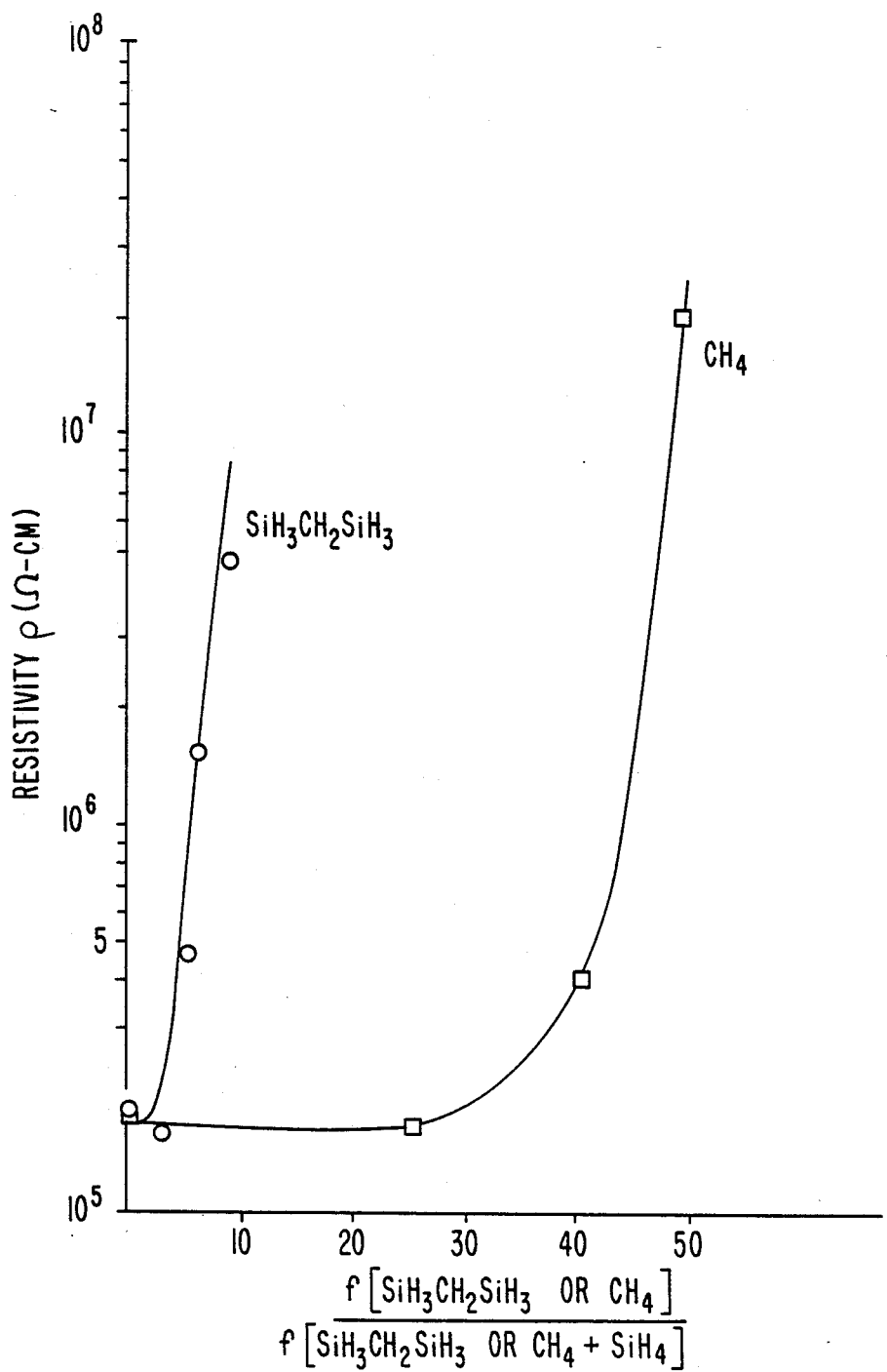
FIG. 10 is a plot of the resistivity as a function of the disilylmethane or methane concentration of (1) a conventional p-layer made using methane as the carbon source and (2) a p-layer made in accordance with the present invention using disilylmethane as the carbon source.

Very little disilylmethane is required to open the band gap of a p-layer in a p-i-n type solar cell. This is illustrated in FIG. 10 which is a plot of the resistivity as a function of the disilylmethane or methane concentration in the p-layers of the control and test solar cells of Example 11. Resistivity increases with increased carbon incorporation. Thus, disilylmethane is a highly efficient source of carbon for incorporation thereof in the hydrogenated amorphous silicon carbon alloy p-layer of a p-i-n type solar cell device.

The dopant materials of the present invention as set forth in formulas II and III above can be synthesized by a number of different methods. The following example reported in E. Amberger and H. Boeters, "Preparation and Properties of Trisilylarsine" Angew. Chem. Int. Ed. 1, 268 (1962) illustrates the preparation of a preferred dopant of formula II, trisilylarsine, (SiH$_3$)$_3$As:

EXAMPLE 12

Trisilylarsine is formed in 48% yield by the reaction of monobromosilane (SiH$_3$Br) with potassium arsinedihydride KAsH$_2$in a 1:1 molar ratio. In this preparation, the two reactants are allowed to warm up slowly together in the previously frozen reaction mediu, dimethyl ether. The reaction begins at −122° C. and is completed at −38° C. after 2 hours. Arsine, ether and unreacted silyl bromide are separated from trisilylarsine by vacuum distillation.

The following example reported in E. Amberger and H. Boeters, "Preparation of Trisilylphosphine," Angew. Chem. Int. Ed. 1, 52 (1962) illustrates the preparation of another preferred formula II dopant, trisilylphosphine, $(SiH_3)_3P$:

EXAMPLE 13

Trisilylphosphine is prepared in 55% yield by the reaction of monobromosilane with potassium dihydrophosphide ($KPH_2$) using a 1:1 molar ratio. The reaction mixture (solvent: dimethyl ether, frozen) is gradually warmed. The reaction begins at $-120°$ C. and is finished at $-40°$ C. Ether, phosphine and unreacted silyl bromide can easily be separated from the trisilylphosphine by high-vacuum distillation.

The following example reported in the Handbook of Preparative Inorganic Chemistry, G. Braver, Ed., Academic Press, N.Y. (1963) at pages 219–220, illustrates the preparation of a preferred formula III dopant of the present invention, boron trifluoride ($BF_3$).

EXAMPLE 14

A mixture of 80 g. of dried or, preferably, melted $KBF_4$ and 30 g. of $B_2O_3$ is heated to about 600° C. in an inclined iron tub (40 cm. long, 3 cm. diameter), which is sealed at one end. The other end of the iron tube is closed by a flange sealed with a copper gasket. An appr. 10-mm. diameter iron tube is welded into an opening in the flange and is connected to a drying tube filled with glass wool, which acts as a dust filler. The drying tube is in turn joined to a quartz or glass trap cooled in liquid nitrogen. The apparatus ends in a drying tube filled with freshly dried KF. The yield is 17 g. of $BF_3$. This can be purified by repeated fractional distillation.

Another preferred formula III dopant difluoroborane ($BHF_2$) is prepared by the pyrolysis of diborane ($B_2H_6$) at 100° C. in the presence of boron trifluoride ($BF_3$). T. D. Coyle, J. J. Ritter and T. C. Farrar, Proc. Chem. Soc. (1964) 25. Small amounts of difluoroborane can also be formed by subjecting a mixture of diborane and boron trifluoride to an electrical discharge. L. Lynds, J. Chem. Phys. 42 (1965) 1124.

The following example reported in A. B. Burg and H. I. Schlesinger, "Hydrides of Boron," JACS 59, 780 (1937) illustrates the preparation of another preferred formula III dopant of the present invention, borane carbonyl ($BH_3CO$).

EXAMPLE 15

70.7 cc. of $B_2H_6$ and 670 cc of CO were condensed into a 615 cc bomb tube at $-210°$ C. The bomb was sealed off, removed from the lower temperature bath, and inverted just as the diborane melted, in order that the liquid running down might evaporate and mix thoroughly with the carbon monoxide. Adequate mixing was made still more certain by allowing the tube to remain for ten hours or longer at room temperature, before the reaction was carried on by a twenty-minute heating in a steam-bath. After the heating, the bomb was cooled to $-196°$ C., and the contents introduced into the vacuum apparatus by means of the vacuum tube opener. 77.8 cc of $BH_3CO$ and 24.9 cc of $B_2H_6$ were then isolated.

The following examples, (Examples 16-17) reflect proposed processes for manufacturing n-layers of p-i-n type photovoltaic devices in accordance with the present invention using the dopants of formula II.

EXAMPLE 16 (Proposed)

A 500Å hydrogenated amorphous silicon alloy n-layer is deposited in a D.C. glow discharge using a cathode current density of 0.12 ma/cm$^2$, a substrate temperature of 240° C., a total gas pressure of 0.5 torr and a flow rate of 12 SCCM of 4% $(SiH_3)_3As$ in $SiH_4$ and 88 SCCM $SiH_4$.

EXAMPLE 17 (proposed)

A 500Å hydrogenated amorphous silicon alloy n-layer is deposited in a D.C. glow discharge using a cathode current density of 0.09 ma/cm$^2$, a substrate temperature of 220° C., a total gas pressure of 0.5 torr and a flow rate of 12 SCCM of 2% $(SiH_3)_3P$ in $SiH_4$, 5 SCCM $(SiH_3)_4Ge$ and 83 SCCM $SiH_4$.

The following examples, (Examples 18-19) reflect proposed processes for manufacturing p-layers of p-i-n type photovoltaic devices in accordance with the present invention using the dopants of formula III.

EXAMPLE 18 (Proposed)

A 100Å hydrogenated amorphous silicon alloy p-layer is deposited using a cathode current density of 0.14 ma/cm$^2$, a substrate temperature of 240° C., a total gas pressure of 0.5 torr and a deposition gas mixture of 10 SCCM $(SiH_3)_4C$, 12 SCCM of 1.5% $BF_3$ in $SiH_4$ and 78 SCCM $SiH_4$.

EXAMPLE 19 (Proposed)

A 100Å hydrogenated amorphous silicon alloy p-layer is deposited using a cathode current density of 0.14 ma/cm$^2$, a substrate temperature of 240° C., a total gas pressure of 0.5 torr and a flow rate of 50 SCCM $CH_4$, 10 SCCM of 3% $BH_2CO$ in $SiH_4$ and 40 SCCM $SiH_4$.

EXAMPLE 20 (Proposed)

A 100Å hydrogenated amorphous silicon alloy p-layer is deposited using a cathode current density of 0.14 ma/cm$^2$, a substrate temperature of 240° C., a total gas pressure of 0.5 torr and a flow rate of 50 SCCM $CH_4$, 12 SCCM of 1.5% $BHF_2$ in $SiH_4$ and 38 SCCM $SiH_4$.

EXAMPLE 21 Proposed)

(A proposed example for forming an n-layer for a p-i-n type photovoltaic device by mercury-sensitized photochemical deposition using monosilylgermane as a deposition feedstock material and trisilylphosphine as a dopant).

Provide a flow of 5 SCCM of monosilylgermane, 12 SCCM of 4% trisilylphosphine and 83 SCCM of silane. Dilute this gas mixture with hydrogen and pre-mix with mercury vapor in a conventional, thermally-controlled mercury vaporizer maintained at about 50° C. Introduce the resulting gas mixture into a deposition chamber. Maintain the pressure of the deposition chamber at about 5.0 torr. Maintain the temperature of the substrates in the deposition chamber at 240° C. Use a conventional low-pressure mercury lamp to radiate intense 1849- and 2537Å resonance lines (30 mW/cm$^2$ at 3-cm distance, with the intensity ratio of 1849-2537Å being 1/6) of light through a transparent quartz window between the lamp and the substrate to excite the mercury atoms which subsequently activates the monosilylgermane, trisilylphosphine and silane by dehydrogenation. Let the resulting deposition proceed until a 500Å layer of negatively-doped hydrogenated amorphous silicon alloy has been deposited.

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. A method of using one or more compounds having the formula:

$$(MX_3)_n M'X_{4-n}$$

wherein M and M' are different Group 4A atoms selected from the group of silicon, germanium, and lead, one of M and M' being silicon, X is hydrogen, halogen, or mixtures thereof, and n is an integer between 1 and 4, inclusive, as a deposition feedstock material in the fabrication of hydrogenated amorphous silicon alloy.

2. The method of claim 1 wherein M is silicon, M' is germanium, and X is hydrogen, fluorine, or mixtures thereof.

3. The method of claim 1 wherein M is silicon and M' is germanium.

4. A process for preparing hydrogenated amorphous silicon alloy by deposition of hydrogenated amorphous silicon alloy film onto a substrate in a deposition chamber comprising the step of introducing into the deposition chamber during deposition a deposition gas mixture which includes one or more compounds having the formula I:

$$(MX_3)_n M'X_{4-n}$$

wherein M and M' are different Group 4A atoms selected from the group of silicon, germanium, and lead, one of M and M' being silicon, X is hydrogen, halogen, or mixtures thereof, and n is an integer between 1 and 4, inclusive.

5. The process of claim 4 wherein the deposition is by glow discharge.

6. The process of claim 5 wherein the deposition is by D.C. glow discharge.

7. The method of claim 5 wherein M is silicon and M' is germanium.

8. The process of claim 4 wherein said compounds of said formula I comprise between about 1 and 50% by volume of said deposition gas mixture.

9. The process of claim 8 wherein said compounds of said formula I comprise between about 1 and 20% by volume of said deposition gas mixture.

10. The process of claim 9 wherein said deposition gas mixture also includes silane.

11. The method of claim 8 wherein M is silicon and M' is germanium.

12. The process of claim 4 wherein M is silicon, M' is germanium, and X is hydrogen, fluorine, or mixtures thereof.

13. The method of claim 4 wherein M is silicon and M' is germanium.

14. A method of manufacturing a semiconductor device comprising on a substrate one or more hydrogenated amorphous silicon alloy regions made from one or more compounds having the formula:

$$(MX_3)_n M'X_{4-n}$$

wherein M and M' are different Group 4A atoms selected from the group of silicon, germanium, and lead, one of M and M' being silicon, X is hydrogen, halogen, or mixtures thereof, and n is an integer between 1 and 4, inclusive.

15. The method of claim 14 wherein M is silicon and M' is germanium.

16. A process for preparing a semiconductor device comprising the step of depositing on a substrate one or more hydrogenated amorphous silicon alloy regions, at least one of the regions being made by introducing into a deposition chamber during deposition a deposition gas mixture which includes one or more compounds having the formula:

$$(MX_3)_n M'X_{4-n}$$

wherein M and M' are different Group 4A atoms selected from the group of silicon, germanium, and lead, one of M and M' being silicon, X is hydrogen, halogen, or mixtures thereof, and n is an integer between 1 and 4, inclusive.

17. The method of claim 16 wherein M is silicon and M' is germanium.

18. A process for manufacturing a photovoltaic device comprising one or more hydrogenated amorphous silicon regions between a front and back contact wherein at least one of the regions is a hydrogenated amorphous silicon alloy made by deposition in a deposition chamber by introducing into the deposition chamber a deposition gas mixture which includes one or more compounds having the formula I:

$$(MX_3)_n M'X_{4-n}$$

wherein M and M' are different Group 4A atoms selected from the group of silicon, germanium, and lead, one of M and M' being silicon, X is hydrogen, halogen, or mixtures thereof, and n is an integer between 1 and 4, inclusive.

19. The process of claim 18 wherein said compound having said formula I is monosilylgermane, and said monosilylgermane comprises about 5% of said deposition gas mixture, with the remainder of said deposition gas mixture comprising silane.

20. The method of claim 18 wherein M is silicon and M' is germanium.

* * * * *